United States Patent [19]

Takekuma et al.

[11] Patent Number: 5,565,285

[45] Date of Patent: *Oct. 15, 1996

[54] METHOD OF MAKING MASK PATTERN DATA AND PROCESS FOR MANUFACTURING THE MASK

[75] Inventors: Toshitsugu Takekuma, Ohme; Toshio Suzuki, Hatoyama-machi; Hidetoshi Iwai, Ohme; Masamichi Ishihara, Hamura, all of Japan

[73] Assignee: Hitachi, Ltd., Tokyo, Japan

[*] Notice: The term of this patent shall not extend beyond the expiration date of Pat. No. 5,458,998.

[21] Appl. No.: 534,829

[22] Filed: Sep. 27, 1995

Related U.S. Application Data

[62] Division of Ser. No. 886,403, May 21, 1992, Pat. No. 5,458,998.

[30] Foreign Application Priority Data

May 22, 1991 [JP] Japan .................................... 3-117355

[51] Int. Cl.⁶ ........................................................ G03F 9/00
[52] U.S. Cl. ................................................. 430/5; 430/311
[58] Field of Search ......................................... 430/5, 311

[56] References Cited

U.S. PATENT DOCUMENTS 5,458,998  10/1995  Takekuma et al. ........................ 430/5

*Primary Examiner*—Mark Chapman
*Attorney, Agent, or Firm*—Antonelli, Terry, Stout & Kraus

[57] ABSTRACT

Pattern data of a phase shift mask can be inspected: (101) by separating and laying out pattern data of a phase shift mask in an actual pattern data layer, an auxiliary pattern data layer and a phase shift pattern data layer; (102) by inspecting and correcting only the data of the actual pattern of the actual pattern data layer; (103) by making data of an estimated pattern estimated to be transferred to a semiconductor wafer from the data of the synthetic data of the correct actual pattern data, the auxiliary pattern data and the phase shift pattern data, which are inspected and corrected; and (104) by comparing the estimated pattern data and the actual pattern data to inspect the data of the auxiliary pattern and the phase shift pattern.

7 Claims, 25 Drawing Sheets

FIG. 8

| | | |
|---|---|---|
| 7a | ACTUAL PATTERN | ▯▯▯ F1 |
| 8a | AUXILIARY PATTERN | NONE |
| 9a PHASE SHIFT PATTERN | FIRST PHASE SHIFT PATTERN | NONE |
| | SECOND PHASE SHIFT PATTERN | ▭ S2 |

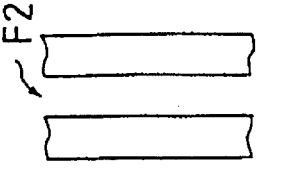

METHOD OF MAKING MASK PATTERN DATA AND PROCESS FOR MANUFACTURING THE MASK

This application is a Division application of application Ser. No. 07/886,403, filed May 21, 1992, now U.S. Pat. No. 5,458,998.

BACKGROUND OF THE INVENTION

The present invention relates to a method of making pattern data of a mask and a technology for manufacturing a mask and, more particularly, to a technology for designing the layout of a mask pattern for an original of a predetermined pattern forming a semiconductor integrated circuit device.

In an ordinary mask of the prior art, a mask pattern formed over a mask substrate is identical to a pattern to be formed over a semiconductor wafer by a designer.

For making data of the mask pattern, therefore, the data of the mask pattern to be formed over the mask substrate is inspected on whether or not the geometric rule and electric rule of the pattern to be formed over the semiconductor wafer are satisfied. On the basis of this inspection result, the data of the mask pattern is corrected by an operator or computer so that it may match the design.

Incidentally, the layout design technology is disclosed on pp. 212 to 214 of "Introduction to MOSLSI Design" issued in 1984 by Sangyo Tosho, for example.

BRIEF SUMMARY OF THE INVENTION

In recent years, the semiconductor integrated circuit device tends to reduce the sizes of elements and wiring lines to be formed over the semiconductor wafer.

Accordingly, it is requested to improve the resolution of a pattern to be transferred to the semiconductor wafer.

The technology for improving the resolution of the pattern to be transferred to the semiconductor wafer is exemplified by the phase shift method.

This phase shift method is a technology for improving the resolution by making use of the mutual interference of transmission lights which are given a phase difference while transmitting through a phase shift mask.

In case of the phase shift method, the pattern formed over the mask substrate and the pattern to be formed over the semiconductor wafer may be partially different, as will be described with reference to FIGS. 37 to FIG. 42.

FIG. 37 shows a pattern 50 to be formed over the semiconductor wafer. This pattern 50 is formed of patterns 50a to 50d, of which the patterns 50a and 50d and the patterns 50b and 50d are sized to the minimum of about 0.35 μm that cannot be resolved by an i-ray, for example.

Now, it is assumed that a pattern 51 (51a to 51d) formed, as shown in FIG. 38, on the mask substrate be identical in shape to the pattern to be formed over the semiconductor wafer, as shown in FIG. 37.

It is also assumed that phase shift pattern films 52a and 52b be arranged over the patterns 51a and 51c of that pattern 51, as shown in FIG. 39.

In this case, there arises no problem because the ray having transmitted through the patterns 51a and 51c arranged with the phase shift pattern films 52a and 52b and the ray having transmitted through the patterns 51b and 51d without the phase shift pattern films 52a and 52b have phases opposite to each other.

Since, however, the ray having transmitted through the pattern 51b and the ray having passed through the pattern 51b are in phase with each other, an unnecessary pattern will be transferred between the patterns 51b and 51d. This problem cannot be avoided merely by changing the arrangement of the phase shift pattern films 52a and 52b.

In this case, therefore, the pattern 51 formed over the mask substrate is changed, for example, in the following manner.

Specifically, as shown in FIG. 40, there is arranged between the patterns 51b and 51d an auxiliary pattern 53a for connecting the patterns 51b and 51d to form a pattern composed of three wiring patterns 54a to 54c running in parallel, as shown in FIG. 41.

As shown in FIG. 42, moreover, patterns 54a and 54c of a pattern 54 are individually arranged thereover with the phase shift pattern films 52a and 52b, and a pattern 54b is arranged thereover with a phase shift pattern film 52c in the position which is arranged with the auxiliary pattern 58a (as shown in FIG. 40).

Thus, since the ray having transmitted through the pattern 54b has a phase difference between the regions having the phase shift pattern film 52c and not, the pattern 50 shown in FIG. 37 can be transferred to the semiconductor wafer.

Thus, in case of the phase shift mask, the pattern 54 formed over the mask substrate and the pattern 50 to be formed over the semiconductor wafer are partially different.

Incidentally, assuming that the pattern formed over the mask substrate and the pattern to be formed over the semiconductor wafer be identical, the data of the pattern formed over the mask substrate is inspected on whether or not the geometric rule and electric rule of the pattern to be formed over the semiconductor wafer are satisfied.

If, however, the inspecting method is to be applied to the data making of the mask pattern of the phase shift mask, the pattern 54b on the mask substrate, as shown in FIG. 42, is decided to be shorted, although it is correct. This is because the pattern has to be separated over the semiconductor wafer.

Specifically, in case the pattern formed over the mask substrate and the pattern to be formed over the semiconductor wafer are different as in the phase shift mask, for example, there arises a problem that the data of the mask pattern cannot be inspected when it is made.

The present invention has been conceived in view of the above-specified problems and has an object to provide a technology capable of inspecting the propriety of the pattern data of a phase shift mask.

The foregoing and other objects and novel features of the present invention will become apparent from the following description to be made with reference to the accompanying drawings.

The representatives of the invention to be disclosed herein will be briefly summarized in the following.

According to a first invention, there is provided a method of making pattern data of a mask, which comprises: a step of laying out, when the pattern data of a mask having a mask pattern and a phase shift pattern on a mask substrate are to be made, said pattern data separately in an actual pattern data layer having data of an actual pattern, in an auxiliary pattern data layer having data of an auxiliary pattern, and in a phase shift pattern data layer having data of a phase shift pattern; a first inspection step of inspecting the propriety of only said actual pattern and repeating the inspection and correction till said actual pattern becomes good; a step of making data of an estimated pattern estimated to be transferred to said substrate by a synthetic pattern of the actual pattern, auxiliary pattern and phase shift pattern, which are formed through said first inspection step; and a second inspection step of comparing said estimated pattern and the actual pattern after said first inspection step and repeating the inspection and correction till they become coincident.

According to a second invention, there is provided a method of making pattern data of a mask, wherein said phase shift pattern data layer is divided into two or more data layers.

According to the above-specified first invention, by separating the pattern data of the phase shift mask into the actual pattern data layer, the auxiliary pattern data layer and the phase shift pattern data layer and by inspecting only the actual pattern, whether or not the actual pattern formed by designing the layout of the pattern of the phase shift mask is good can be decided by using the inspection method of the prior art as it is.

Moreover, a synthetic pattern of the inspected actual pattern, the auxiliary pattern and the phase shift pattern is formed to form the estimated pattern to be formed over the semiconductor wafer or the like by the synthetic pattern, so that the propriety of the auxiliary pattern and the phase shift pattern of the phase shift mask can be decided by comparing The estimated pattern and the inspected actual pattern.

According to the above-specified second invention, the pattern data in the phase shift pattern data layer, for example, is further separated by the difference in the graphic processing so that the separated data layers can be independently processed to facilitate the data processing.

BRIEF DESCRIPTION OF THE DRAWINGS

FIG. 8 is a diagram for explaining a step of comparing an estimated pattern and an actual pattern in case the pattern of FIG. 3 is to be formed;

FIG. 21 is a diagram for explaining a step of comparing the estimated pattern and the actual pattern in case the data of the pattern of FIG. 19 is made;

FIG. 22 is a diagram for explaining a step of comparing the estimated pattern and the actual pattern in case the data of the pattern of FIG. 19 is made;

DETAILED DESCRIPTION OF THE INVENTION

[Embodiment 1]

Figure 1:
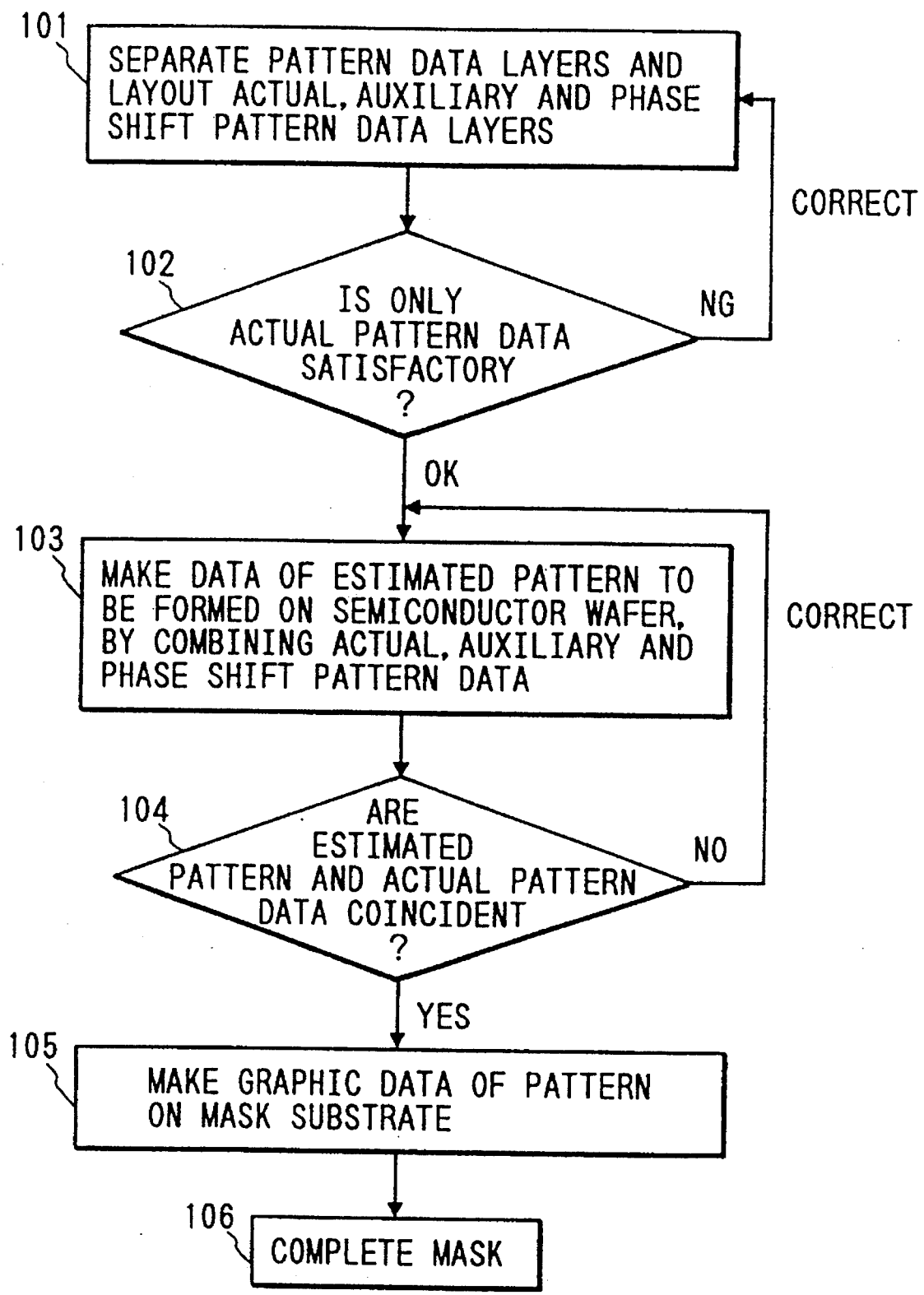
FIG. 1 is a flow chart for explaining a method of making pattern data of a mask according to one embodiment of the present invention.
Figure 2:
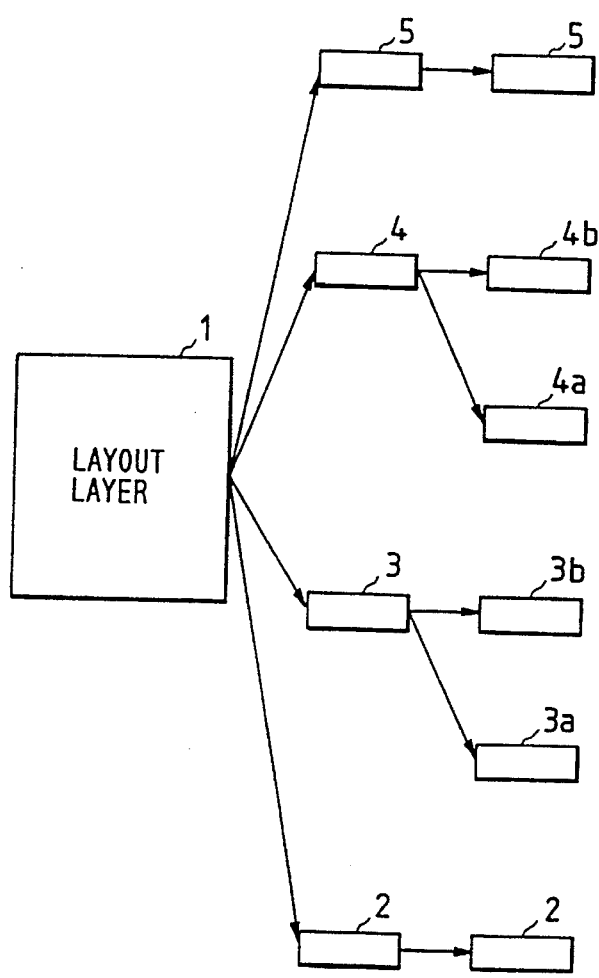
FIG. 2 is a diagram for explaining a data storage state of a layout layer during the pattern data making step.
Figure 3:
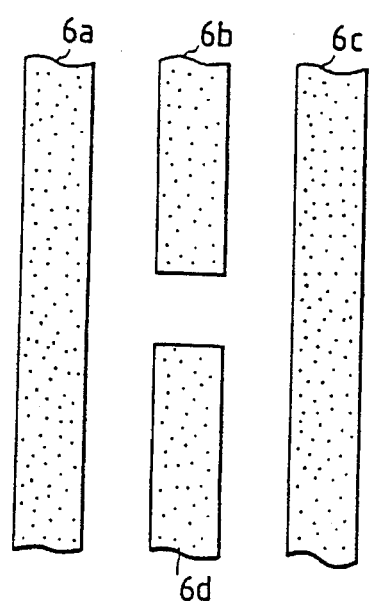
FIG. 3 is a top plan view showing an essential portion of an example of the pattern to be transferred to a semiconductor wafer.
Figure 4:
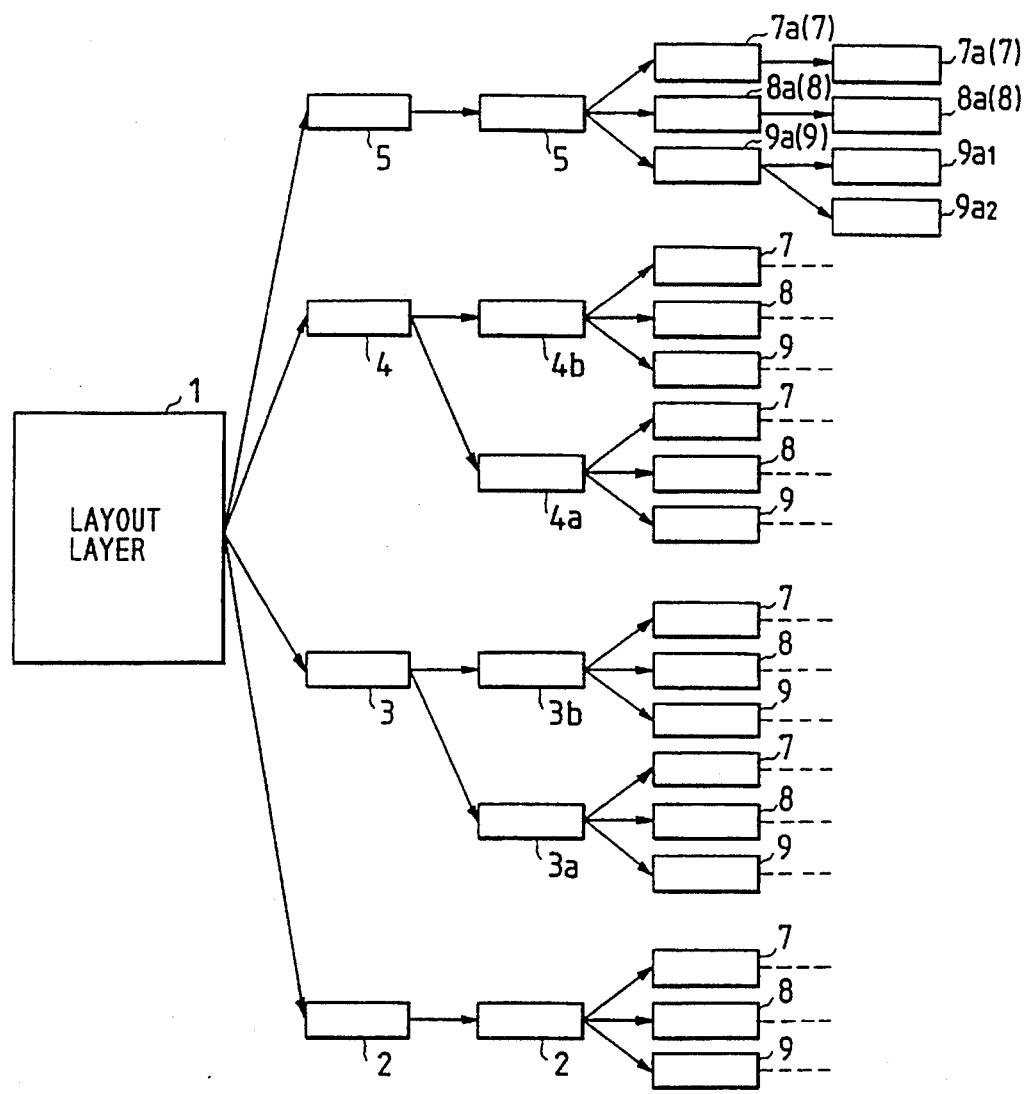
FIG. 4 is a diagram for explaining the data storage state of a layout layer during the pattern data making step.
Figure 5:
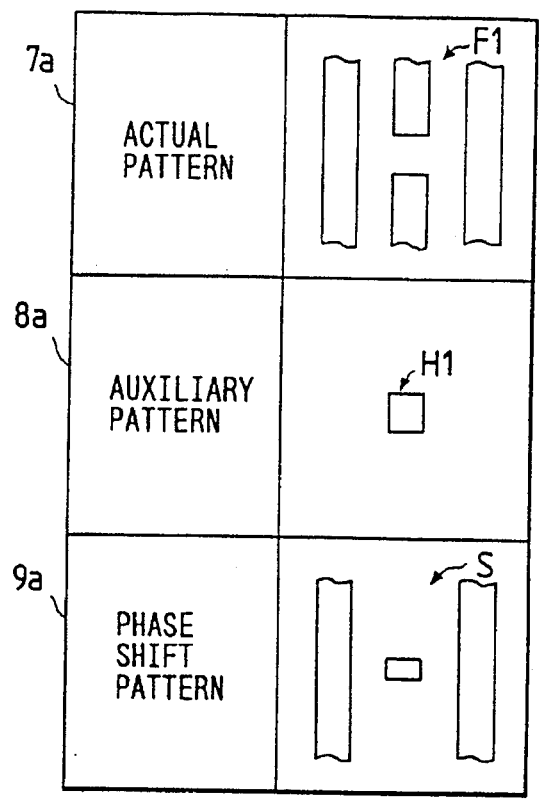
FIG. 5 is a diagram schematically showing examples of the individual patterns stored in a pattern data layer.
Figure 6:
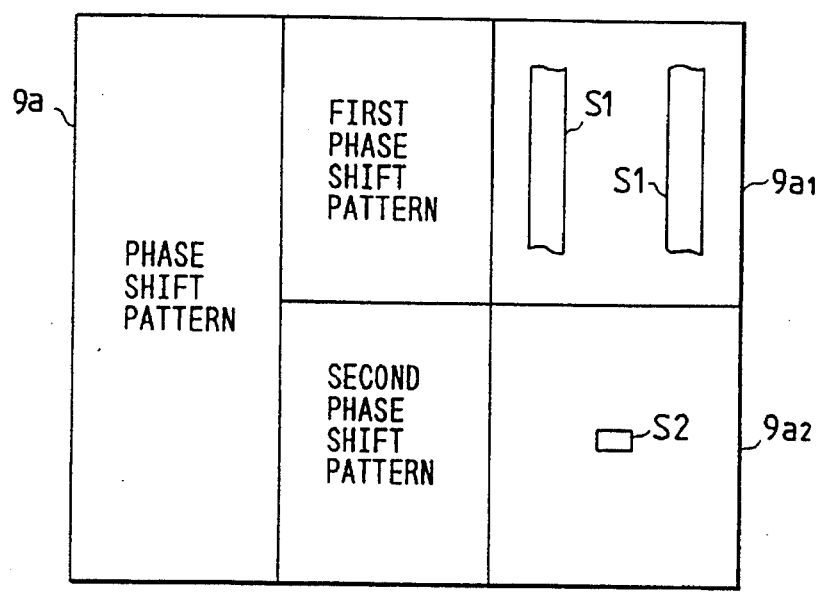
FIG. 6 is a diagram schematically showing examples of the individual patterns stored in a pattern data layer.
Figure 10:
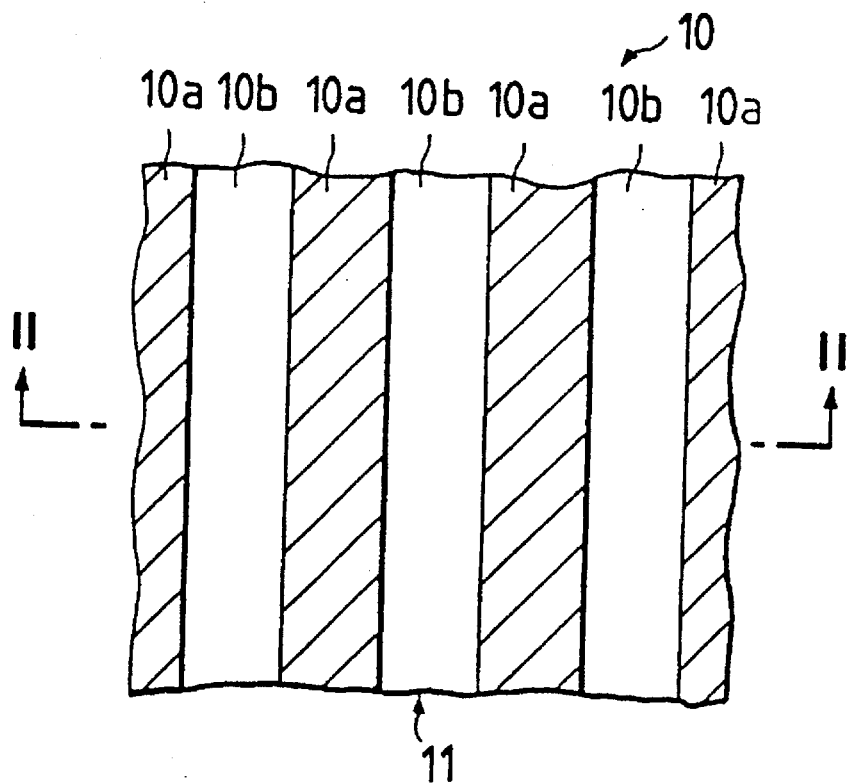
FIG. 10 is a top plan view showing an essential portion of a mask pattern formed over a mask substrate.
Figure 11:
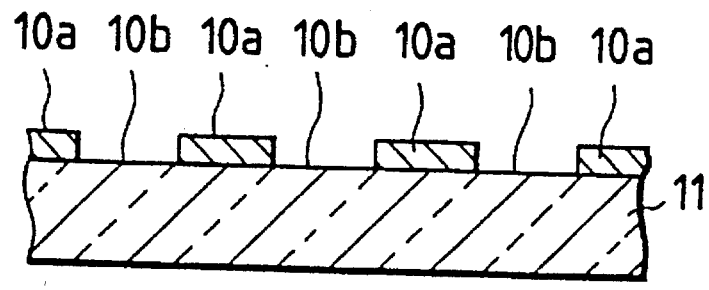
FIG. 11 is a section taken along line A—A of FIG. 10.
Figure 12:
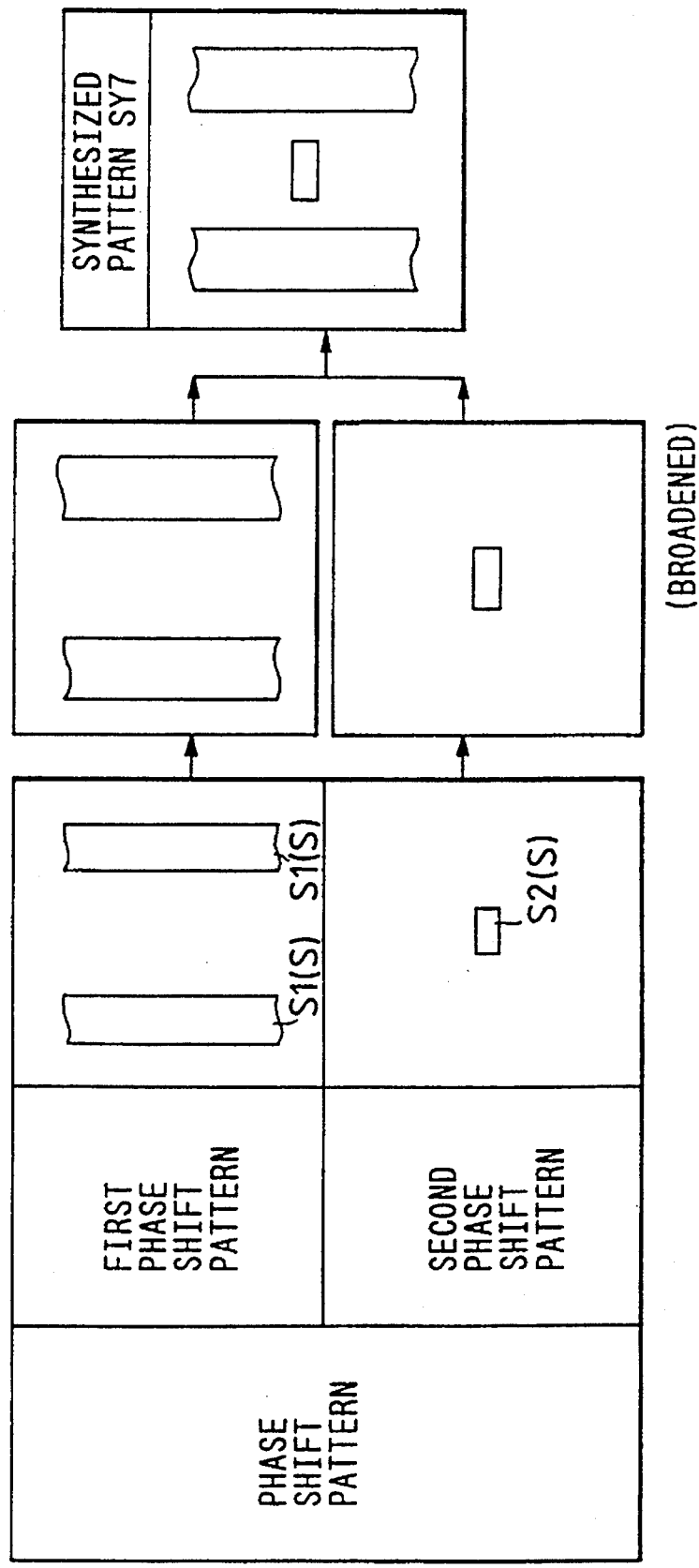
FIG. 12 is a diagram for explaining a broadening process.
Figure 13:
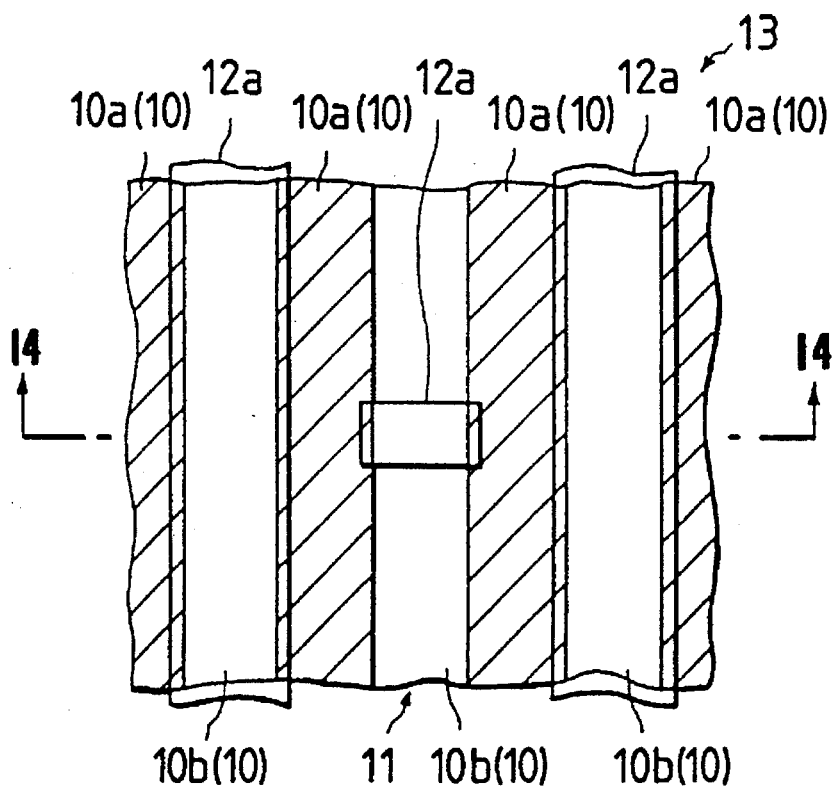
FIG. 13 is a top plan view showing an essential portion of a mask pattern and a phase shift pattern formed over the mask substrate.
Figure 14:
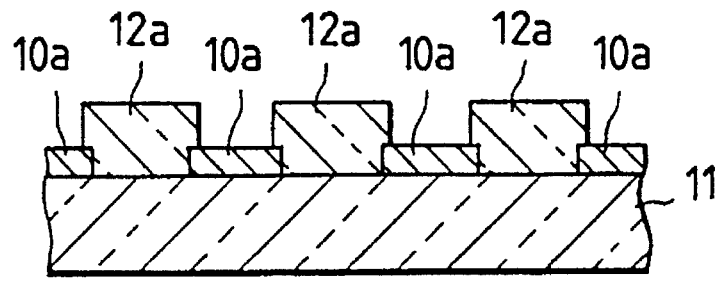
FIG. 14 is a section taken along line B—B of FIG. 13.
Figure 16:
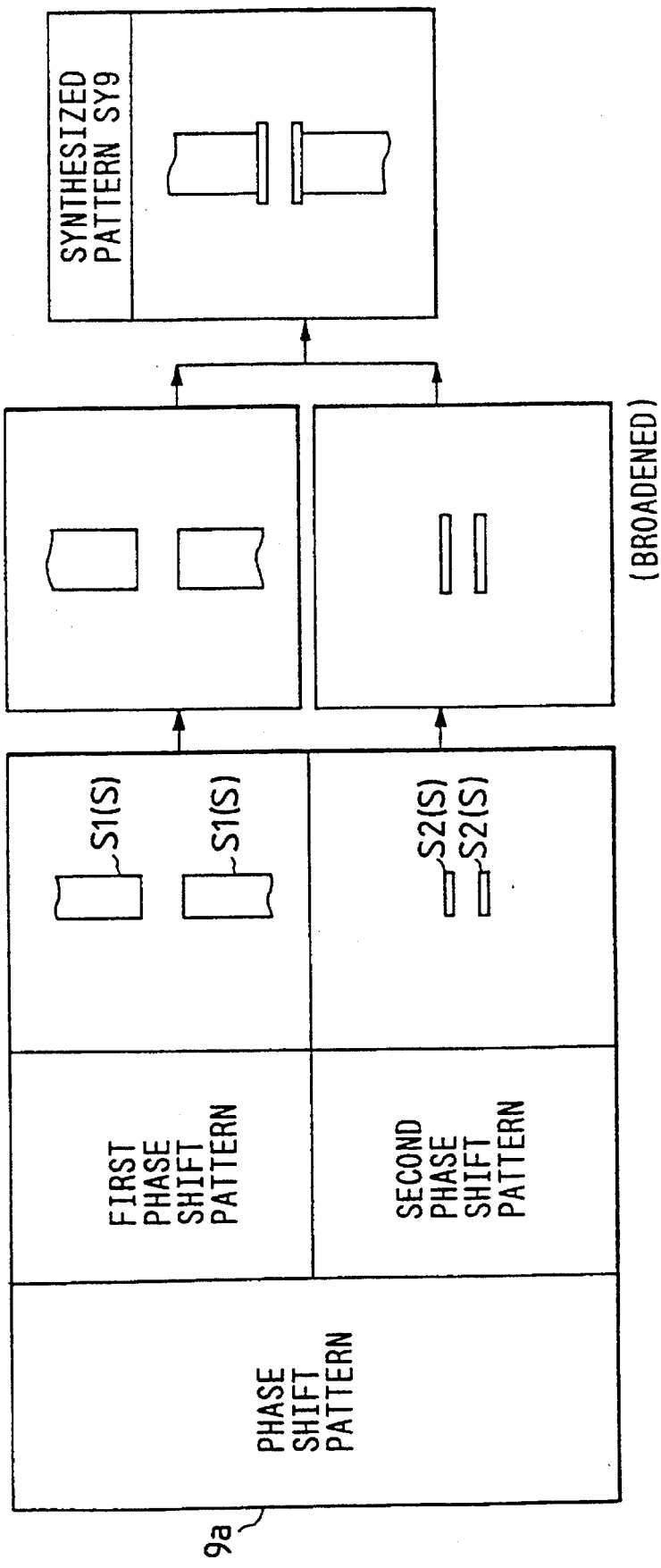
FIG. 16 is a diagram for explaining the broadening process.
Figure 17:
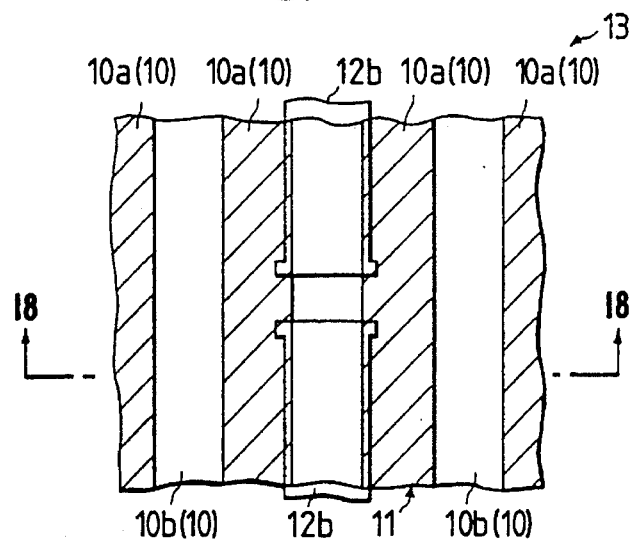
FIG. 17 is a top plan view showing an essential portion of a mask pattern and a phase shift pattern formed over the mask substrate.
Figure 18:
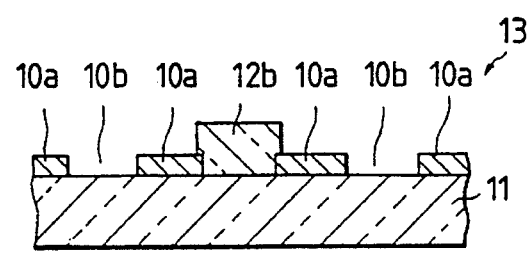
FIG. 18 is a section taken along line C—C of FIG. 17.

FIG. 1 is a flow chart for explaining a method of making pattern data of a mask according to one embodiment of the present invention; FIG. 2 is a diagram for explaining a data storage state of a layout layer during the pattern data making step; FIG. 3 is a top plan view showing an essential portion of an example of the pattern to be transferred to a semiconductor wafer; FIG. 4 is a diagram for explaining the data storage state of a layout layer during the pattern data making step; FIGS. 5 and 6 are diagram schematically showing examples of the individual patterns stored in pattern data layers; FIGS. 7 to 9 and FIG. 15 are diagrams for explaining steps of comparing estimated patterns and actual patterns in case the pattern of FIG. 3 is to be formed; FIG. 10 is a top plan view showing an essential portion of a mask pattern formed over a mask substrate; FIG. 11 is a section taken along line A—A of FIG. 10; FIGS. 12 and 16 are diagrams for explaining broadening processes; FIGS. 13 and 17 are top plan views showing essential portions of mask patterns and phase shift patterns formed over the mask substrate; FIG. 14 is a section taken along line B—B of FIG. 13; and FIG. 18 is a section taken along line C—C of FIG. 17.

The mask pattern data making method according to the present embodiment 1 is exemplified by a pattern data making method of a phase shift mask.

FIG. 2 is a diagram for explaining a data storage state of a layout layer 1 during the pattern data making step of the phase shift mask of the present embodiment 1.

As shown in FIG. 2, the layout layer 1 is divided into a plurality of pattern data layers 2 to 5.

At this stage, each of the pattern data layers 2 to 5 is a data layer for manufacturing one sheet of phase shift mask.

On the other hand, the pattern data layer 3, for example, is separated into pattern data layers 3a and 3b in accordance with the necessity for a data processing. The pattern data layer 4 is also separated into pattern data layers 4a and 4b in accordance with the necessity for a data processing.

In the present embodiment 1, for example, the following procedure is taken from that state. In the following description, the pattern data making method of the phase shift mask of the present embodiment 1 will be described in accordance with the steps of FIG. 1 with reference to FIGS. 8 to 18 by exemplifying the case in which wiring patterns 6a to 6d shown in FIG. 3 are to be transferred to a (not-shown) semiconductor wafer.

First of all, in the present embodiment 1, the pattern data layers 2, 3a, 3b, 4a, 4b and 5 are separated into and laid out (at Step 101) in an actual pattern data layer 7, an auxiliary pattern data layer 8 and a phase shift pattern layer 9.

The actual pattern data layer 7 is one which is stored with the data of an actual pattern having the same shape as that to be formed over the semiconductor wafer.

Moreover, the auxiliary pattern data layer 8 is one which is stored with the data of an auxiliary pattern needed for forming a pattern over the semiconductor wafer although not transferred to the semiconductor wafer.

Still moreover, the phase shift pattern data layer 9 is one which is stored with the data of a phase shift pattern for establishing a phase difference in a ray to transmit therethrough.

In case the wiring patterns 6a to 6d shown in FIG. 3 are to be formed, for example, an actual pattern data layer 7a, an auxiliary pattern data layer 8a and a phase shift pattern data layer 9a are desired to be stored respectively with the data of an actual pattern F1, an auxiliary pattern H1 and a phase shift pattern S shown in FIG. 5, for example.

In the present embodiment 1, moreover, the phase shift pattern data layer 9a is divided into first and second phase shift pattern data layers $9a_1$, and $9a_2$, as shown in FIGS. 4 and 6.

This is because a first phase shift pattern S1 and a second phase shift pattern S2 of FIG. 6 have different broadened extents. These broadening extents are the difference between the mask size and the mask size, i.e., the scale-up and -down of the pattern on the data.

Since the first and second phase shift patterns S1 and S2 are different in the scale-up extent and manner, it is easier to process the data layer if the layer is so divided that the individuals can be independently processed.

For example, the first phase shift pattern S1 may be isotropically scaled up in its entirety. However, the second phase shift pattern S2 may have different scale-up extents in the transverse and longitudinal directions in FIG. 6.

This is because the transverse size of the second phase shift pattern S2 of FIG. 6 is set in a manner to anticipate the matching margin with the mask pattern, whereas the longitudinal size of the same is set on the basis of the size between the patterns 6b and 6d shown in FIG. 3.

However, the broadening procedure had better be performed by laying out the actual pattern, which is extracted on-line from the actual pattern data layer 7a, as the first phase shift pattern S1 to form a correct phase shift pattern S, and subsequently by forming the graphic data of a phase shift pattern on the basis of the data of the correct phase shift pattern S. Then, this performance could eliminate the wastefulness.

These actual pattern data layer 7, auxiliary pattern data layer 8 and phase shift pattern data layer 9 can have their pattern data processed individually and independently and synthesized.

And, these pattern data or the like can be displayed on a (not-shown) display and and visualized.

Subsequently, only the data of the actual pattern of the actual pattern data layer 7 is inspected (at 102) as by the conventional method whether or not the geometric rule, the electric rule and so on are satisfied.

If NOT, the data of the actual pattern are repeatedly corrected and inspected till the data are satisfied.

Incidentally, the improper portion, which is found as a result of the inspection, is displayed on the aforementioned display.

Moreover, the data of the auxiliary pattern and the phase shift pattern are corrected if they are required for the corrections by the correction of the actual pattern.

In case the actual pattern data satisfy the inspection, the data of the correct actual pattern, the auxiliary pattern and the phase shift pattern, which were obtained through the inspection and correction steps, are composed to make (at Step 103) data of an estimated pattern to be transferred to the semiconductor wafer on the basis of the data of the synthetic pattern.

Subsequently, the data of the estimated pattern and the data of the correct actual pattern obtained through the aforementioned inspection and correction steps are compared (at Step 104).

If the data of the estimated pattern and the actual pattern fail to be coincide, the correction and inspection of the pattern data are repeated till the coincidence is obtained.

Figure 7:
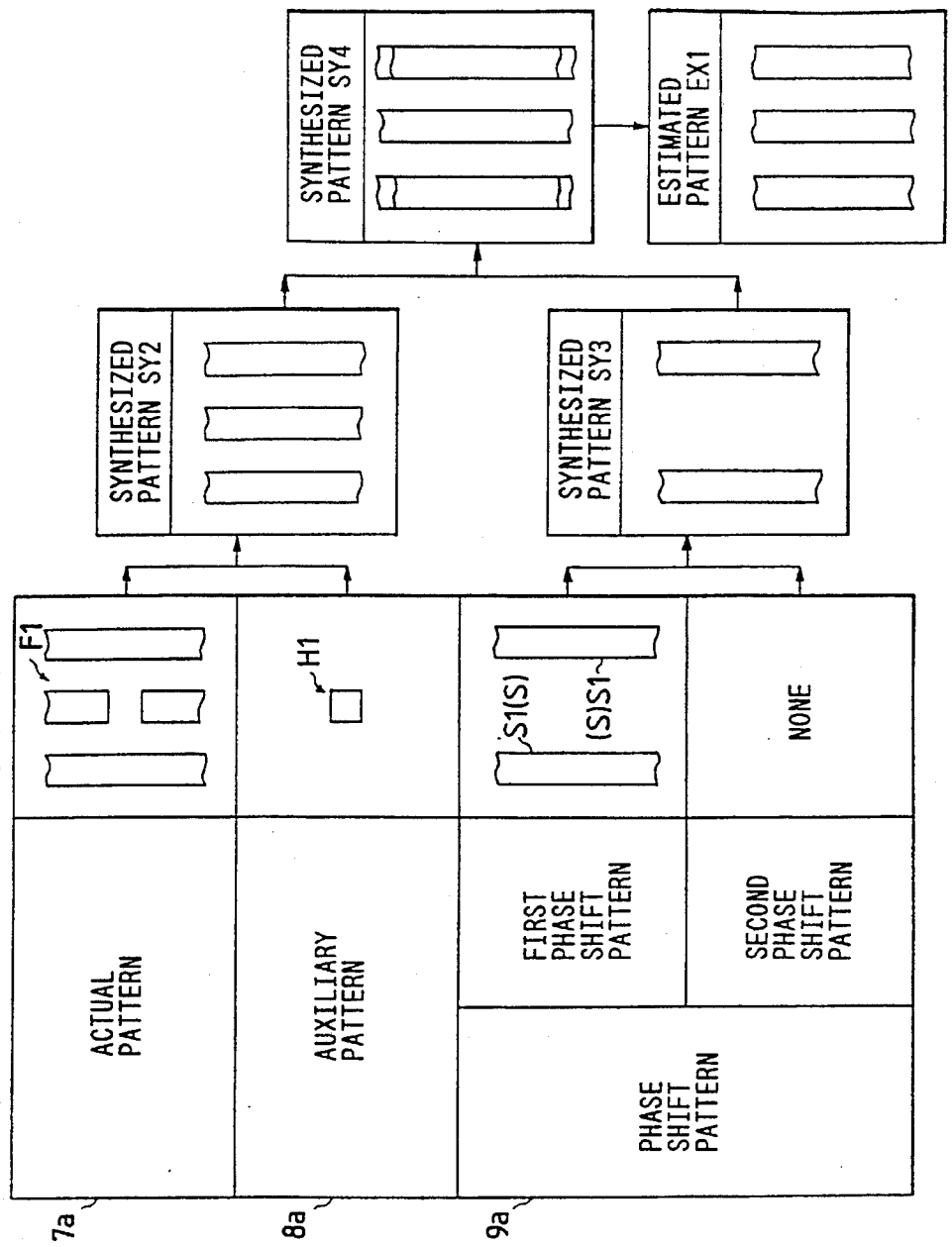
FIG. 7 is a diagram for explaining a step of comparing an estimated pattern and an actual pattern in case the pattern of FIG. 3 is to be formed.

Let it be assumed that the data of the actual pattern F1, the auxiliary pattern H1 and the phase shift pattern S shown in FIG. 7 be made, for example. In this case, the following data processing is performed.

First of all, for example, there are made the data of a synthesized pattern SY2 of the actual pattern F1 and the auxiliary pattern H1, and the data of a synthetic pattern SY3 of the first phase shift pattern S1 and the second phase shift pattern.

Subsequently, on the basis of the data of the synthetic pattern SY4, the data of an estimated pattern EX1, as shown in the same Figure, are made and compared with the data of the actual pattern F1.

Since, in this case, the data of the estimated pattern EX1 and the data of the actual pattern F1 are not coincident, it can be decided that either or both of the auxiliary pattern H1 and the phase shift pattern S are erroneous. Here, the second phase shift pattern has an error and is corrected.

In the absence of the auxiliary pattern, as shown in FIG. 8, a contradiction to the definition of the phase shift method occurs to make neither the data of the synthetic pattern nor the pattern of the estimated pattern of the actual pattern, the auxiliary pattern and the phase shift pattern.

Here, the data of the auxiliary pattern and the first phase shift pattern are erroneous and are corrected.

In case, on the other hand, the data of the estimated pattern and the actual pattern are coincident, the graphic data of the mask pattern are made on the basis of the data of the synthetic pattern of the actual pattern and the auxiliary pattern, and the graphic data of the phase shift pattern are made on the basis of the synthetic pattern of the first and second phase shift pattern (at Step 105).

From those graphic data, moreover, the mask pattern and the phase shift patterns are formed over the mask substrate by the photolithography technology to manufacture the phase shift mask (at Step 106).

Figure 9:
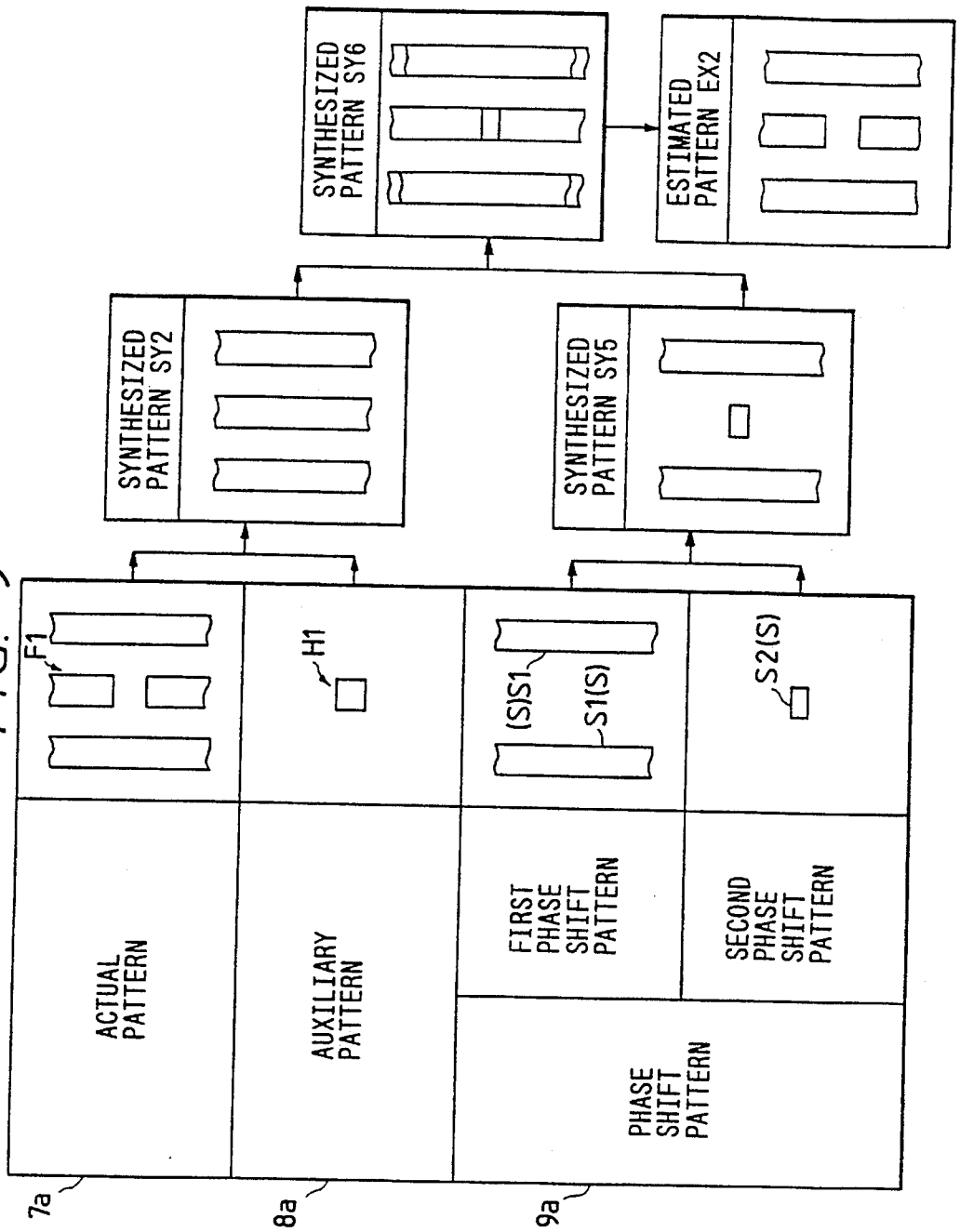
FIG. 9 is a diagram for explaining a step of comparing an estimated pattern and an actual pattern in case the pattern of FIG. 3 is to be formed.

Let it be assumed that the data of the actual pattern F1, the auxiliary pattern H1 and the phase shift pattern S of FIG. 9 be made. This is in the desired state shown in FIG. 5. Then, the following data processing is accomplished.

First of all, the data of a synthetic pattern SY6 are made from the data of the synthetic pattern SY2 of the actual pattern F1 and the auxiliary pattern H1 and the data of a synthetic pattern SY5 of the first phase shift pattern S1 and the second phase shift pattern S2.

Subsequently, the data of an estimated pattern EX2 made on the basis of the data of the synthetic pattern SY6 are compared with the data of the actual pattern F1.

Since, in this case, the data of the estimated pattern EX2 and the data of the actual pattern F1 are coincident, it can be decided that the data of the auxiliary pattern HI and the phase shift pattern S are correct.

Thus, the graphic data of the mask pattern are made on the basis of the data of the synthetic pattern SY2 of the actual pattern F1 and the auxiliary pattern H1.

On the basis of the graphic data thus made of the mask pattern, moreover, a mask pattern 10 shown in FIGS. 10 and 11 is formed over the mask substrate 11 by the photolithography technology or the like.

The mask pattern 10 is one for forming hatched shielding regions 10*a* and transmitting regions 10*b* on a mask substrate 11. The shielding regions 10 are made of chromium (Cr) or the like. On the other hand, the mask substrate 11 is made of quartz or the like.

Moreover, the graphic data of the phase shift pattern are made on the basis of the data of the synthetic pattern SY5 of the first and second phase shift patterns S1 and S2.

When the graphic data of the phase shift pattern are to be made, the data of the first and second phase shift patterns S1 and S2 are broadened to different extents to synthesize their pattern data so that the graphic data of the phase shift pattern are made on the basis of the data of the synthetic pattern SY7.

On the basis of the graphic data thus made of the phase shift pattern, moreover, a phase shift pattern film 12*a* is formed in a predetermined position on the mask substrate 11 by the photolithography technology, as shown in FIGS. 13 and 14, to manufacture a phase shift mask 13.

Incidentally, the presence and absence of the phase shift pattern film 12*a* can be reversed and arranged on the mask substrate 11.

Figure 15:
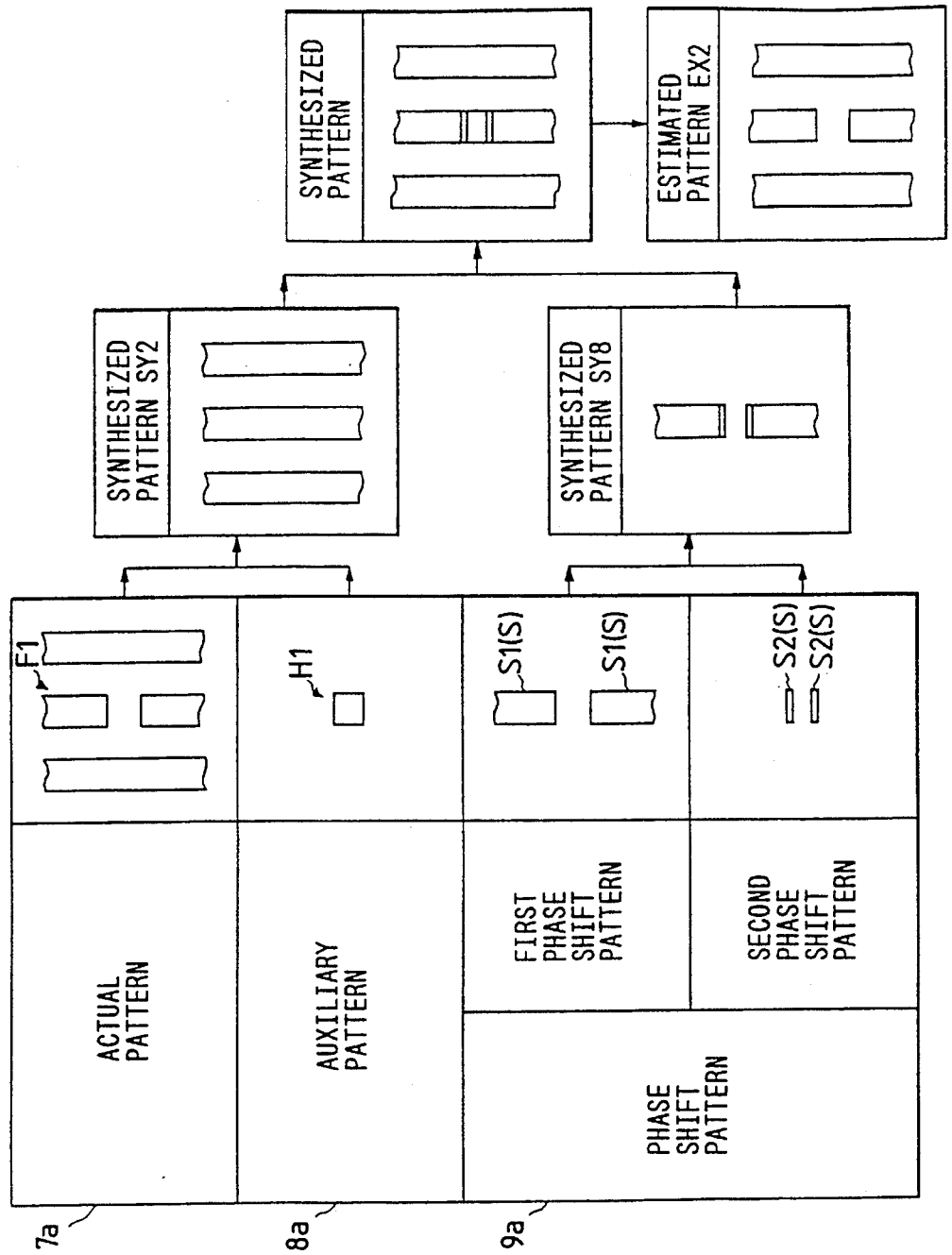
FIG. 15 is a diagram for explaining a step of comparing the estimated pattern and the actual pattern in case the pattern of FIG. 3 is formed.

In case, on the other hand, the data of the actual pattern F1, the auxiliary pattern H1 and the phase shift pattern S shown in FIG. 15 are made, the data of the estimated pattern EX2 and the actual pattern F1 are caused to be coincident by performing a process similar to the aforementioned one.

In this case, moreover, the graphic data of the mask pattern are made on the basis of the data of the synthetic pattern SY2 of the actual pattern F1 and the auxiliary pattern H1.

On the other hand, the graphic data of the phase shift pattern are made on the basis of the data of a synthetic pattern SY8 of the first and second phase shift patterns S1 and S2.

In this case, when the graphic data of the phase shift pattern are to be made, as shown in FIG. 16, the data of the first and second phase shift patterns S1 and S2 are broadened to different extents so that the graphic data of the phase shift pattern are made on the basis of the data of the synthetic pattern SY9.

On the basis of the graphic data thus made of the mask pattern and the phase shift pattern, moreover, the mask pattern 10 and a phase shift pattern film 12*b* shown in FIGS. 17 and 18 are formed over the mask substrate 11 by the photolithography technology to manufacture the phase shift mask 13.

Incidentally, the presence and absence of the phase shift pattern film 12*b* can be reversed and arranged on the mask substrate 11.

Thus, the following effects can be attained according to the present embodiment 1.

(1) Since the layout layer 1 of the phase shift mask is separated into the actual pattern data layer 7, the auxiliary pattern data layer 8 and the phase shift pattern data layer 9 so that the propriety of the data of the actual pattern only is inspected, the propriety of the actual pattern data of the pattern data of the phase shift mask can be decided by using the inspecting method of the prior art as it is.

Moreover, the data of the synthetic pattern of the inspected actual pattern, the auxiliary pattern and the phase shift pattern are made to make the estimated pattern to be formed over the semiconductor wafer so that the propriety of the data of the auxiliary pattern and the phase shift pattern of the phase shift mask can be decided by comparing the data of the estimated pattern and the data of the inspected actual pattern.

As a result, the propriety of the pattern data of the phase shift mask can be inspected.

(2) Thanks to the aforementioned effect (1), the reliability of the pattern data of the phase shift mask 13 can be improved.

(3) Since the pattern data in the pattern data layer can be further separated in dependence upon the difference in the graphic processing such as the broadening, the separated data can be independently processed to facilitate the data processing so that the automatic processing by a computer or the like can be promoted.

[Embodiment 2]

Figure 19:
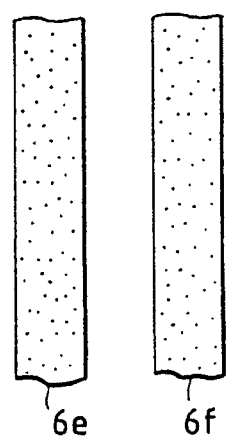
FIG. 19 is a top plan view showing an essential portion to be transferred to the semiconductor wafer for explaining a method of making pattern data of a mask according to another embodiment of the present invention.
Figure 25:
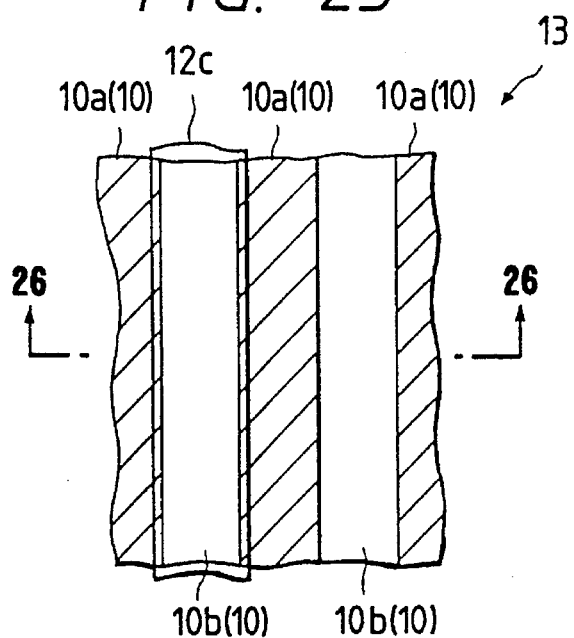
FIG. 25 is a top plan view showing an essential portion of a mask pattern and a phase shift pattern for forming the pattern of FIG. 19.
Figure 26:
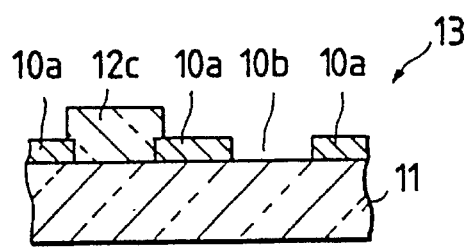
FIG. 26 is a section taken along line D—D of FIG. 25.

FIG. 19 is a top plan view showing an essential portion to be transferred to the semiconductor wafer for explaining a method of making pattern data of a mask according to another embodiment of the present invention; FIGS. 20 to 24 are diagrams for explaining steps of comparing the estimated patterns and the actual patterns in case the pattern of FIG. 19 is formed; FIG. 25 is a top plan view showing an essential portion of a mask pattern and a phase shift pattern for forming the pattern of FIG. 19; and FIG. 26 is a section taken along line D—D of FIG. 25.

In the present embodiment 2, the method of forming pattern data of a mask will be described following the steps of FIG. 1 with reference to FIGS. 19 to 26 by exemplifying the case in which wiring patterns 6e and 6f shown in FIG. 19 are to be transferred to a semiconductor wafer, for example.

Incidentally, in the present embodiment 2, the wiring patterns 6e and 6f are exemplified by patterns having such a line width about 1 μm as can be resolved by the i-ray and have a spacing of about 0.35 μm.

In this case, the auxiliary pattern need not be formed, and the present embodiment 2 will be described in case of no auxiliary pattern.

Moreover, the present embodiment 2 have their Steps 101 and 102 of FIG. 1 shared with those of the foregoing embodiment 1 and will be described from the Step 103 of FIG. 1.

Figure 20:
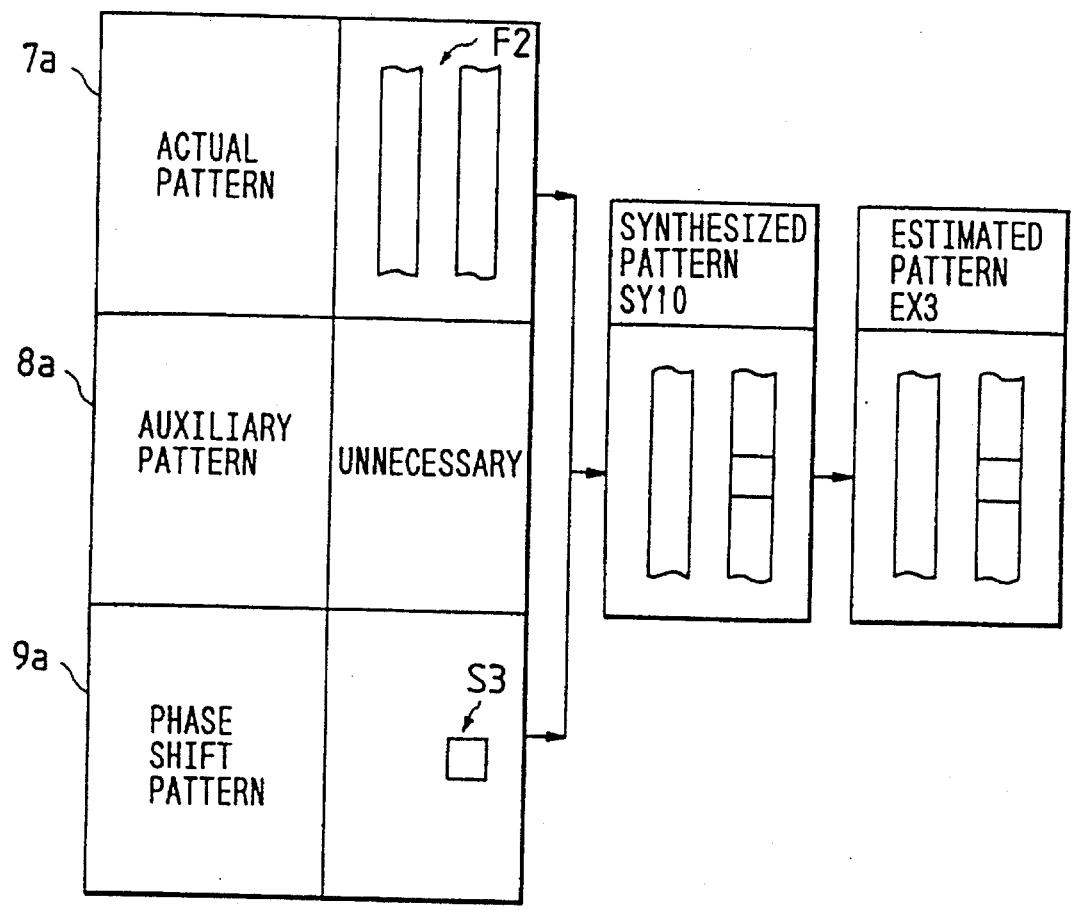
FIG. 20 is a diagram for explaining a step of comparing the estimated pattern and the actual pattern in case the data of the pattern of FIG. 19 is made.

Let it be assumed that the data of an actual pattern F2 and a phase shift pattern S3 shown in FIG. 20 be made, namely, that the phase shift pattern S3 be deficient. In this case, the following data processing will be performed.

First of all, like the foregoing embodiment 1, the data of an estimated pattern EX3 made on the basis of the data of a synthetic pattern SY10 of the actual pattern F2 and the phase shift pattern S3 are compared (at Steps 103 and 104) with the data of the actual pattern F2.

Since, in this case, the data of the estimated pattern EX3 and the data of the actual pattern F2 are not coincident, it can be decided that the phase shift pattern S3 has an error. Thus, this phase shift pattern S3 is corrected.

It is further assumed that the data of the actual pattern F2 and a phase shift pattern S4 shown in FIG. 21 be made. In this case, the phase shift pattern S4 made is absolutely identical to the actual pattern F2.

This case is contrary to the definition of the phase shift method so that the estimated pattern is not formed. As shown in FIG. 22, moreover, the case of no phase shift pattern is also contrary to the definition of the phase shift method so that the estimated pattern is not formed. In these cases, the phase shift pattern is corrected.

Figure 23:
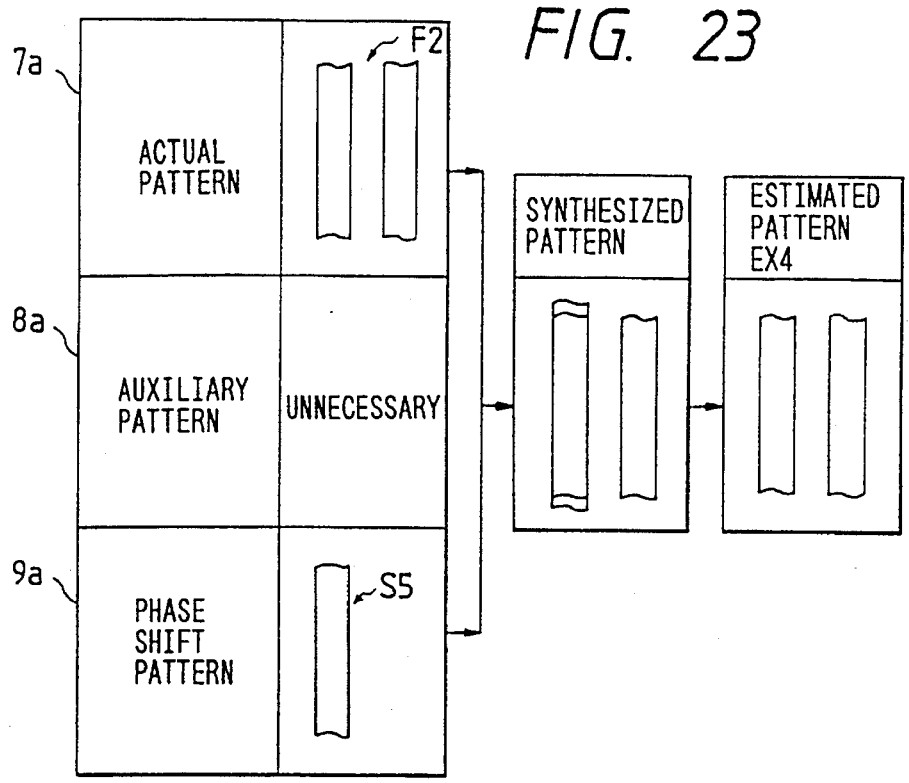
FIG. 23 is a diagram for explaining a step of comparing the estimated pattern and the actual pattern in case the data of the pattern of FIG. 19 is made.
Figure 24:
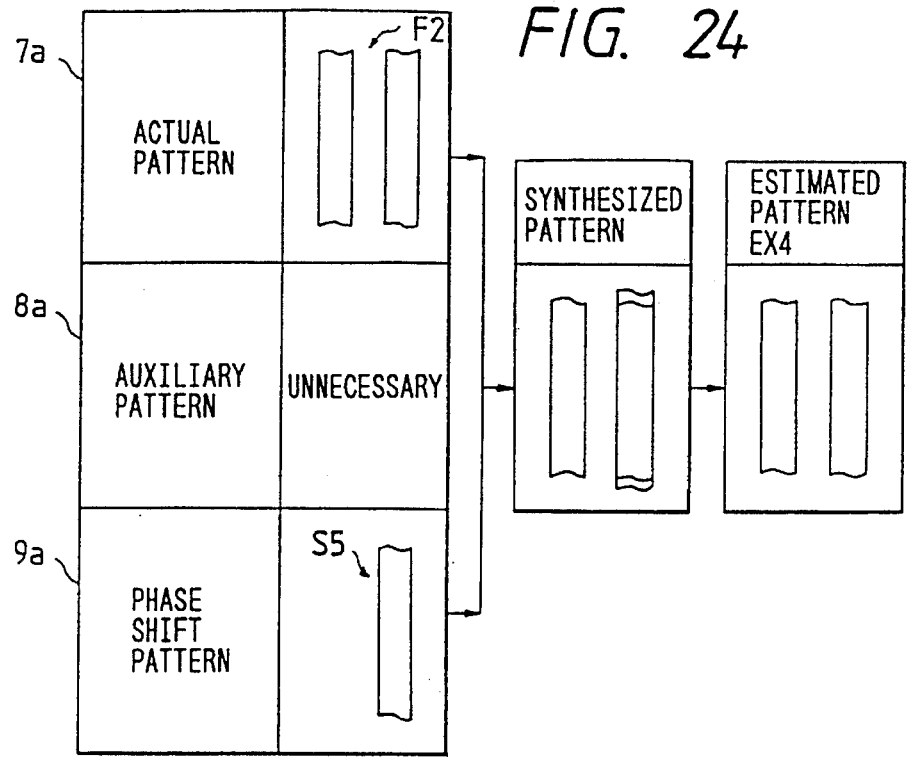
FIG. 24 is a diagram for explaining a step of comparing the estimated pattern and the actual pattern in case the data of the pattern of FIG. 19 is made.

In case, on the other hand, the data of the actual pattern F2 and a phase shift pattern S5 shown in FIG. 23 or 24 are made, the data of an estimated pattern EX4 and the data of the actual pattern F2 are coincident, if compared. Thus, it can be decided (at Steps 103 and 104).

In this case, therefore, the graphic data of the mask pattern are made on the basis of the data of the actual pattern F2, and the graphic data of the phase shift pattern are made (at Step 105) on the basis of the data of the phase shift pattern S5.

Incidentally, when the graphic data of the phase shift pattern are to be made, the data of the phase shift pattern S5 are broadened to a predetermined extent like the foregoing embodiment 1.

On the basis of the graphic data thus made of the mask pattern and the phase shift pattern, moreover, the mask pattern 10 and a phase shift pattern film 12c shown in FIGS. 25 and 26 are formed over the mask substrate 11 by the photolithography technology or the like to manufacture the phase shift mask 13 (at Step 106).

Incidentally, the presence and absence of the phase shift pattern film 12c can be reversed and arranged on the mask substrate 11.

According to the present embodiment 2 thus far described, the effects similar to those of the foregoing embodiment 1 can be achieved.

[Embodiment 3]

Figure 27:
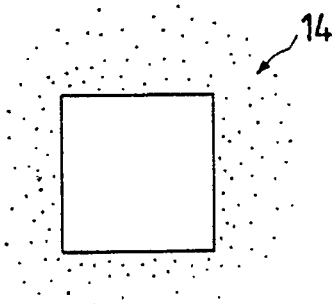
FIG. 27 is a top plan view showing an essential portion to be transferred to the semiconductor wafer for explaining a method of making pattern data of a mask according to still another embodiment of the present invention.
Figure 28:
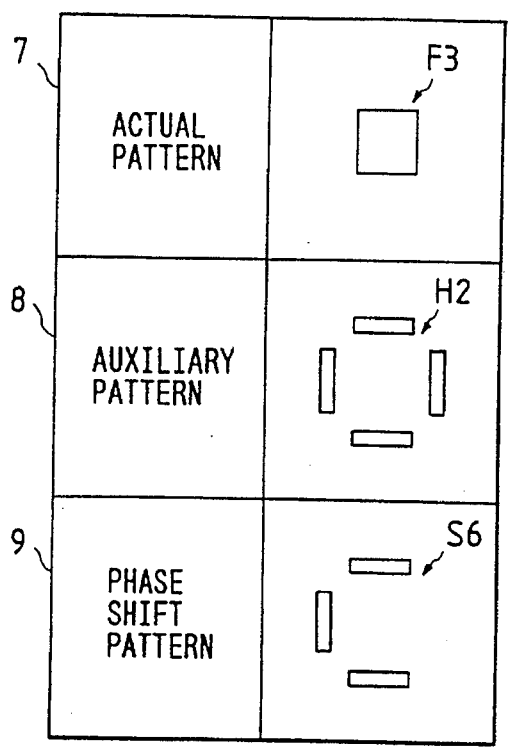
FIG. 28 is a diagram for explaining a step of comparing the estimated pattern and the actual pattern in case the data of the pattern of FIG. 27 is made.
Figure 29:
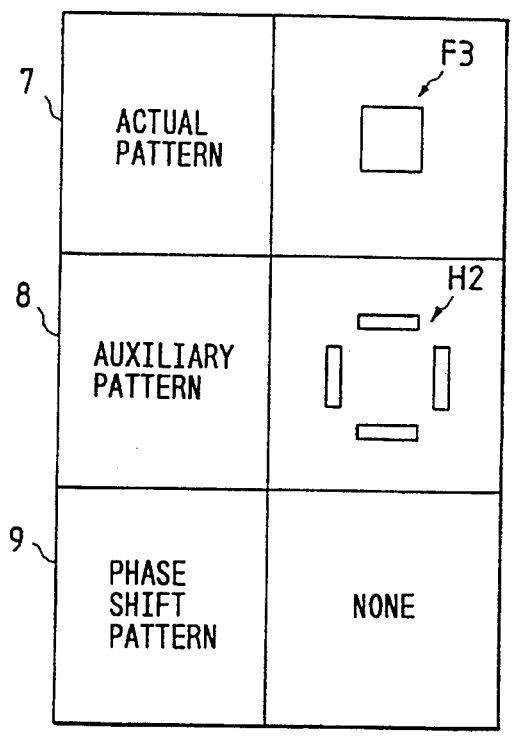
FIG. 29 is a diagram for explaining a step of comparing the estimated pattern and the actual pattern in case the data of the pattern of FIG. 27 is made.
Figure 30:
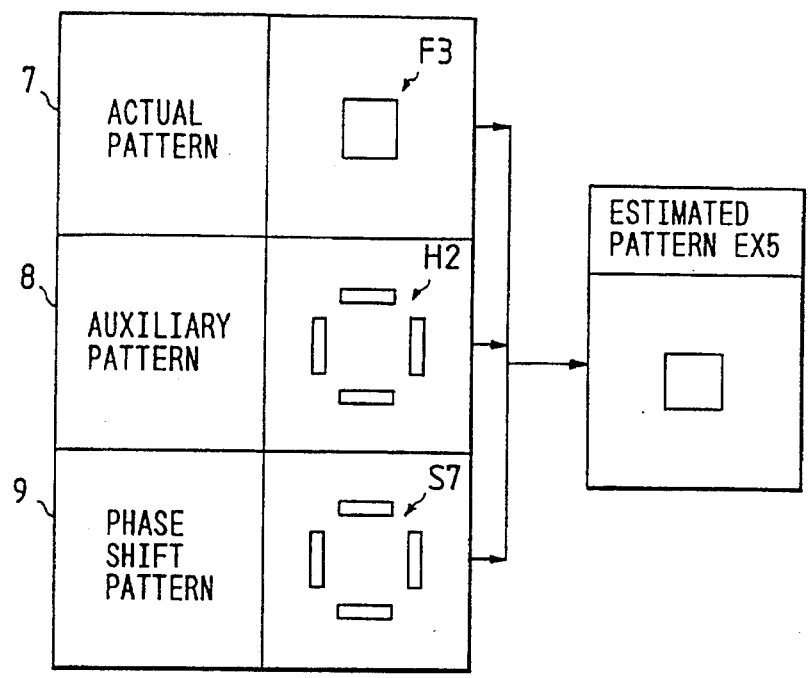
FIG. 30 is a diagram For explaining a step of comparing the estimated pattern and the actual pattern in case the data of the pattern of FIG. 27 is made.
Figure 33:
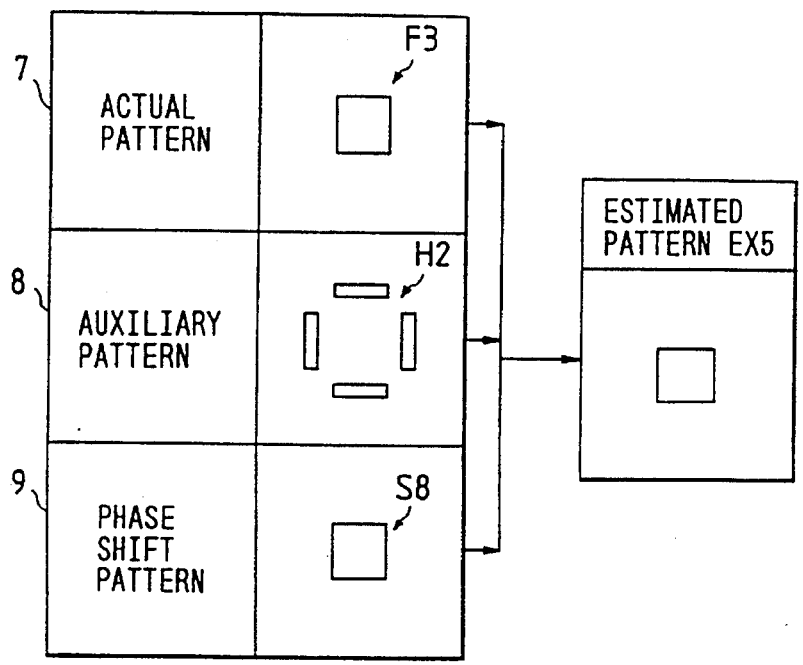
FIG. 33 is a diagram for explaining a step of comparing the estimated pattern and the actual pattern in case the data of the pattern of FIG. 27 is made.
Figure 31:
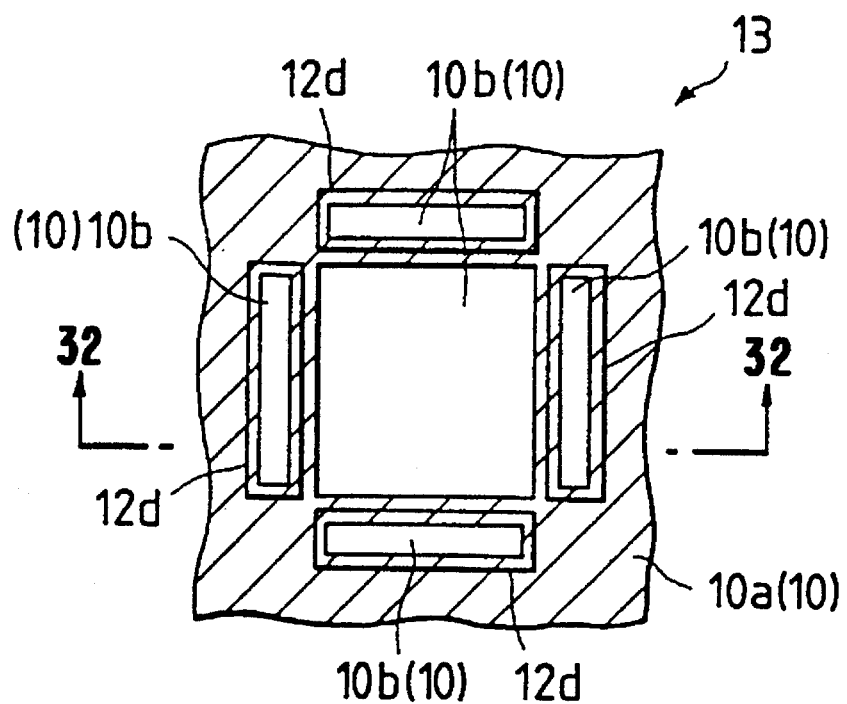
FIG. 31 is a top plan view showing an essential portion of the mask pattern and the phase shift pattern for forming the pattern of FIG. 27.
Figure 32:
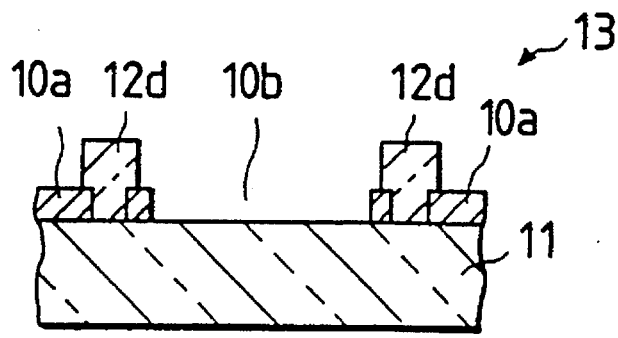
FIG. 32 is a section taken along line E—E of FIG. 31.
Figure 34:
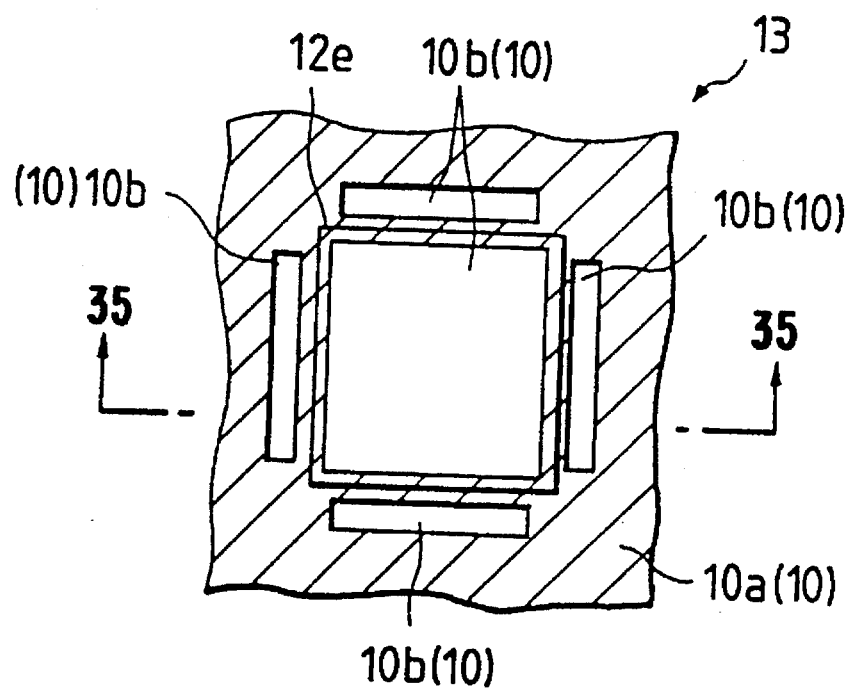
FIG. 34 is a top plan view showing an essential portion of the mask pattern and the phase shift pattern for forming the pattern of FIG. 27.
Figure 35:
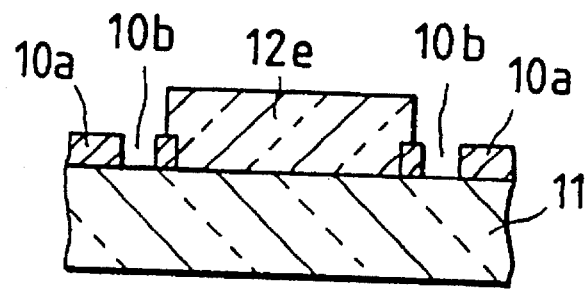
FIG. 35 is a section taken along line K—K of FIG. 34.

FIG. 27 is a top plan view showing an essential portion to be transferred to the semiconductor wafer for explaining a method of making pattern data of a mask according to still another embodiment of the present invention; FIGS. 28 to 30 are diagrams for explaining steps of comparing the estimated patterns and the actual patterns in case the data of the pattern of FIG. 27 is made; FIGS. 31, 33 and 34 are top plan views showing essential portions of the mask patterns and the phase shift patterns for forming the pattern of FIG. 27; FIG. 32 is a section taken along line E—E of FIG. 31; and FIG. 35 is a section taken along line K—K of FIG. 34.

In the present embodiment 3, the mask pattern data making method will be described along with the steps of FIG. 1 with reference to FIGS. 27 to 35 by exemplifying the case in which a connection hole pattern 14 shown in FIG. 27 is to be transferred to the semiconductor wafer.

Incidentally, the present embodiment 3 have their Steps 101 and 102 of FIG. 1 similar to those of the foregoing embodiment 1 and will be described from the Step 103 of FIG. 1.

Let it be assumed that the data of actual pattern F3, auxiliary pattern H2 and phase shift pattern S6 be made. In other words, the phase shift pattern S6 is partially deficient.

This case is contrary to the definition of the phase shift method so that no estimated pattern is formed. As shown in FIG. 29, moreover, the case of no phase shift pattern is also contrary to the definition of the phase shift method so that no estimated pattern is formed. In These cases, therefore, the phase shift pattern is corrected.

On the other hand, let it be assumed that the data of the actual pattern F3, the auxiliary pattern H2 of the phase shift pattern S6 shown in FIG. 30 be made.

Since, in this case, the data of an estimated pattern EX5 and the data of the actual pattern F2 are coincident, if compared, it can be decided (at Steps 103 and 104) that the auxiliary pattern H2 and the phase shift patterns S6 and S7 are correct.

In this case, therefore, the graphic data of the mask pattern are made on the basis of the data of the synthesized pattern of the actual pattern F3 and the auxiliary pattern H2, and the graphic data of the phase shift pattern are made (at Step 105) are made on the basis of the data of the phase shift pattern S7.

When the graphic data of the phase shift pattern are to be made, the data of the phase shift pattern S7 are broadened to a predetermined extent like the foregoing embodiment 1.

On the basis of the graphic data thus made of the mask pattern and the phase shift pattern, moreover, the mask pattern 10 and the phase shift pattern film 12d shown in FIGS. 31 and 32 are formed over the mask substrate 11 by the lithography technology or the like to manufacture the phase shift mask 13 (at Step 106).

Incidentally, the presence and absence of the phase shift pattern film 12d can be reversed and arranged over the mask substrate 11.

Even in case the data of the actual pattern F3, the auxiliary pattern H2 and the phase shift pattern S8 shown in FIG. 33 are made, the data of the estimated pattern EXS and the data of the actual pattern F2 are coincident if compared (at Steps 103 and 104).

In this case, too. the graphic data of The mask pattern are made on the basis of the data of the synthesized pattern of the actual pattern F3 and the auxiliary pattern H2, and the graphic data of the phase shift pattern are made on the basis of the data of the phase shift pattern S8 (at Step 105).

On the basis of the graphic data thus made of the mask pattern and the phase shift pattern, moreover, the mask pattern 10 and the phase shift pattern film 12e shown in FIGS. 34 and 35 are formed over the mask substrate 11 by the lithography technology or the like to manufacture the phase shift mask 18 (at Step 106).

Incidentally, the presence and absence of the phase shift pattern film 12e can be reversed and arranged over the mask substrate 11.

Thus in the present embodiment 3, too, effects similar to those of the aforementioned embodiment 1 can be achieved.

Although our invention has been specifically described in connection with the embodiments thereof, it should not be restricted to the foregoing embodiments 1 to 3 but can naturally be modified in various manners without departing from the gist thereof.

In the foregoing embodiments 1 to 3, for example, if the data of the estimated pattern and the data of the actual pattern are decided to be incoincident by their comparing inspection, the data of the auxiliary pattern or the phase shift patter are corrected, and the data of an estimated pattern are made again so that they may be inspectively compared with the data of the actual pattern. Despite of this description, the present invention should not be limited thereto but can be modified in the following various manners.

Figure 36:
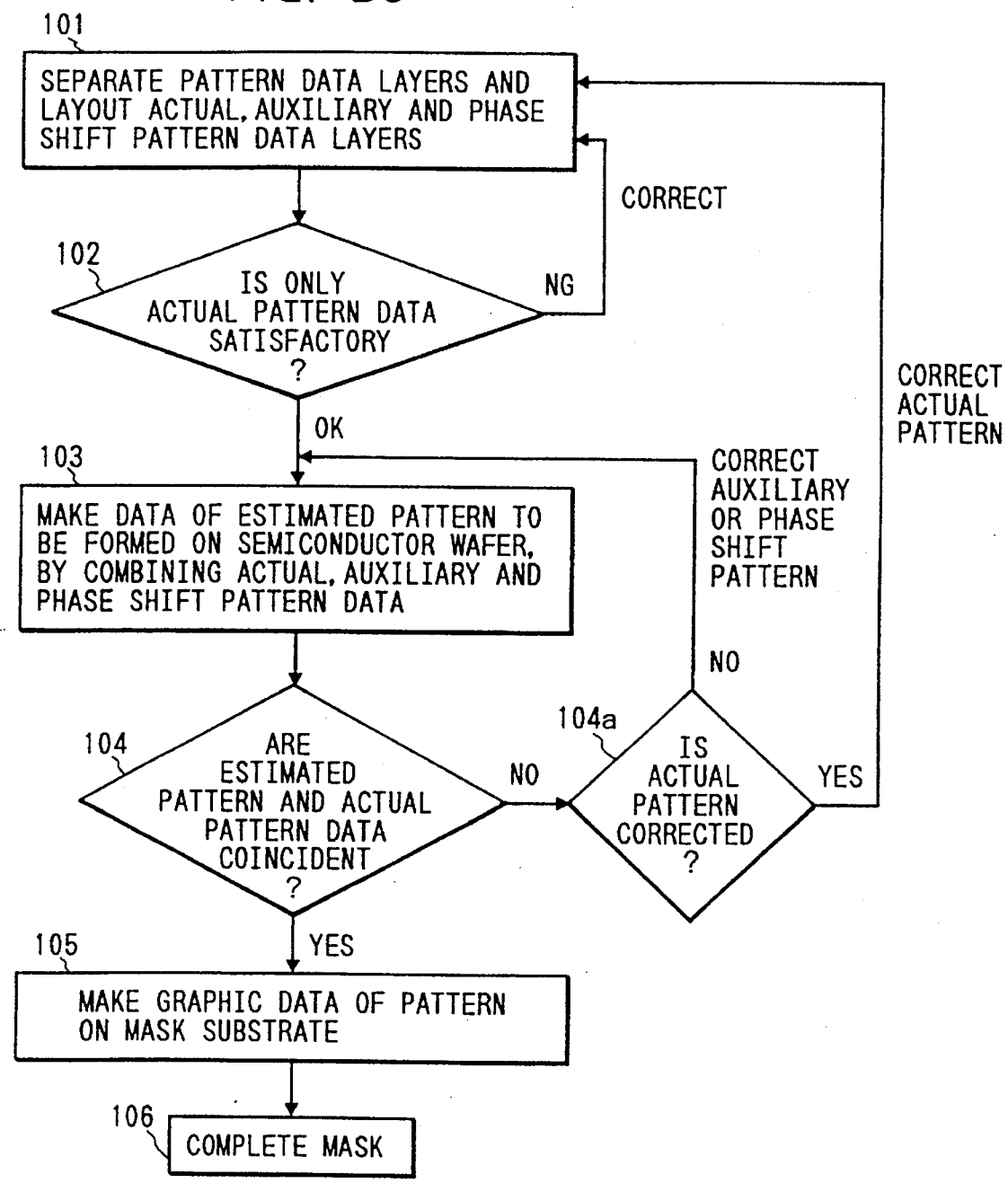
FIG. 36 is a flow chart for explaining a method of making pattern data of a mask according to another embodiment of the present invention.
Figure 37:
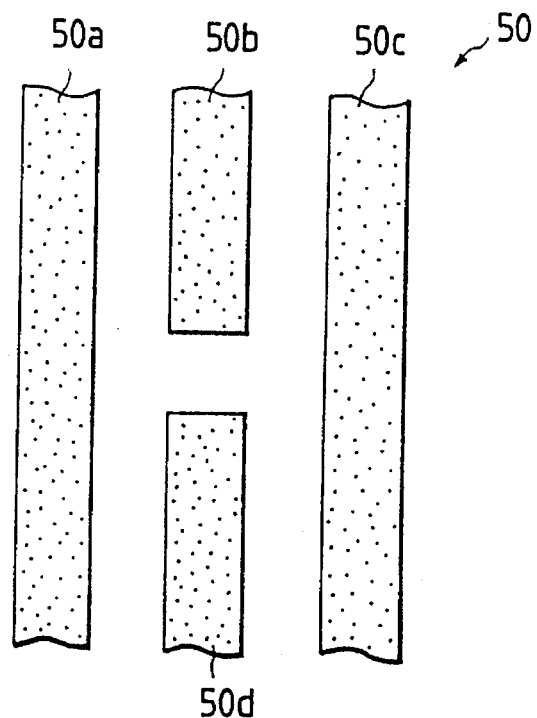
FIG. 37 is a diagram for explaining that a mask pattern over a phase shift mask and a pattern to be formed over a semiconductor wafer are different.
Figure 38:
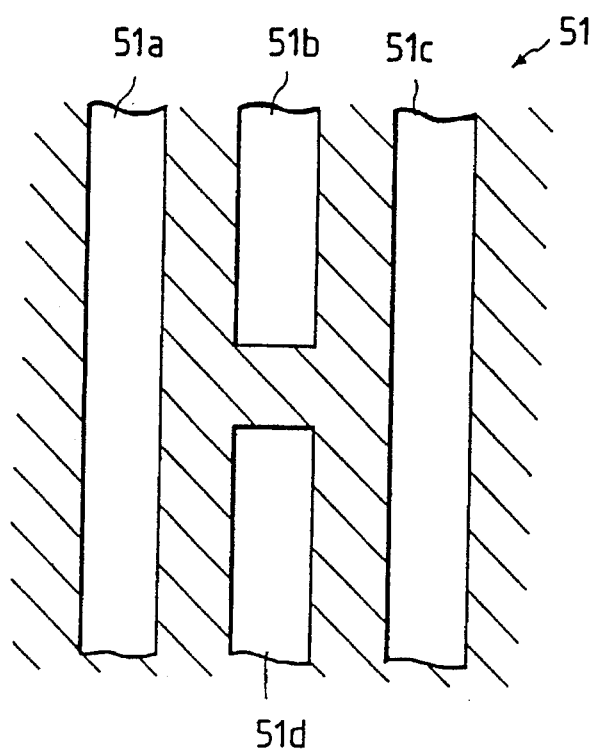
FIG. 38 is a diagram for explaining that a mask pattern over a phase shift mask and a pattern to be formed over a semiconductor wafer are different.
Figure 39:
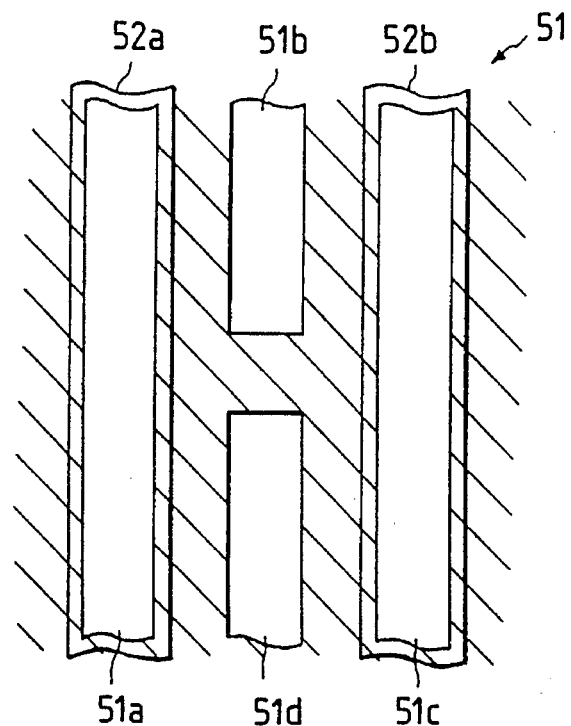
FIG. 39 is a diagram for explaining that a mask pattern over a phase shift mask and a pattern to be formed over a semiconductor wafer are different.
Figure 40:
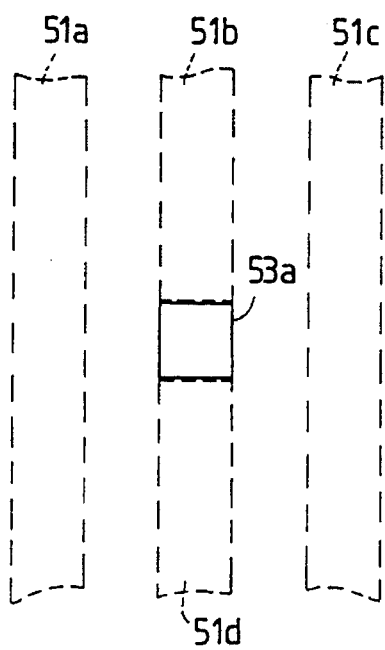
FIG. 40 is a diagram for explaining that a mask pattern over a phase shift mask and a pattern to be formed over a semiconductor wafer are different.
Figure 41:
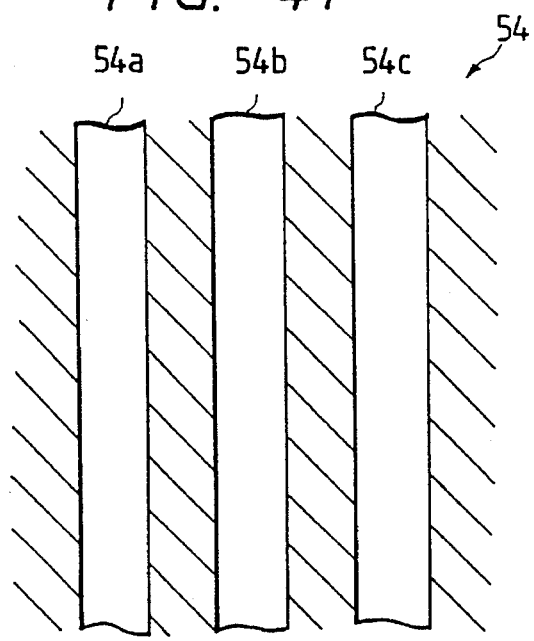
FIG. 41 is a diagram for explaining that a mask pattern over a phase shift mask and a pattern to be formed over a semiconductor wafer are different.
Figure 42:
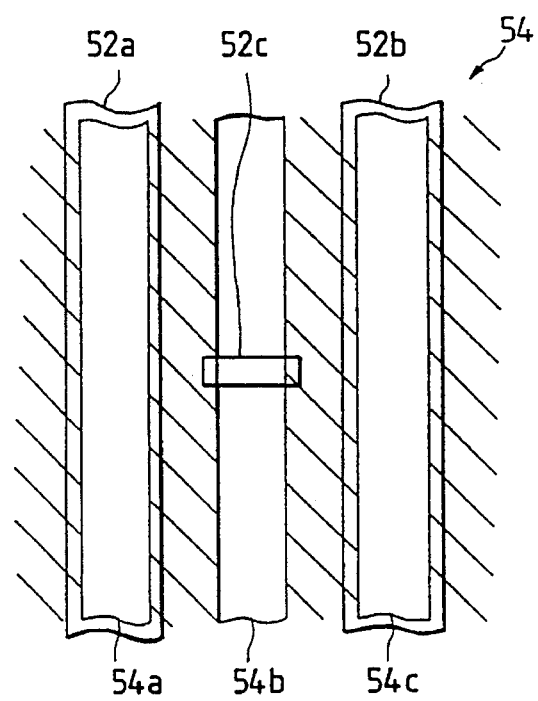
FIG. 42 is a diagram for explaining that a mask pattern over a phase shift mask and a pattern to be formed over a semiconductor wafer are different.

If the data of the estimated pattern and the data of the actual pattern are decided to be incoincident, as shown in FIG. 36, it is decided whether or not the data of the actual pattern is to be corrected (at Step 104a)

Then, the data of the actual pattern are corrected, if necessary, and the routine returns to the Step 101.

If the data of the actual pattern need not be corrected, on the other hand, the data of the auxiliary pattern or the phase shift pattern are corrected to return the routine to the Step 103.

In this case, the data of the estimated pattern and the data of the actual pattern are inspectively compared, and a change, if any, in the data of the actual pattern can be responded to.

Another processing can be taken, as follows. If it is decided that the data of the estimated pattern and the data of the actual pattern are decided to be incoincident, the data of the auxiliary pattern or the phase shift pattern are corrected, and only the data of the actual pattern are inspected.

Moreover, an error, if found, in the data of the actual pattern is corrected. If no error is found in the data of the actual pattern, on the other hand, an estimated pattern is formed again so that its data is inspectively compared with the data of the actual pattern.

If, in this case, the actual pattern should be erroneously changed at the time of a correction after the inspective comparison between the data of the estimated pattern and the data of the actual pattern, the error can be detected to improve the reliability of the pattern data better.

The effects to be obtained from the representative of the invention disclosed herein will be briefly described in the following.

(1) According to the first invention thus far described, the pattern data of the phase shift mask is divided into the actual pattern data layer, the auxiliary pattern data layer and the phase shift pattern data layer, and only the actual pattern data is inspected. Thus, the propriety of the actual pattern of the pattern data of the phase shift mask can be decided, while the pattern data of the phase shift mask are being made, by using the inspection method of the prior art as it is.

Moreover, the synthetic pattern of the inspected actual pattern, the auxiliary pattern and the phase shift pattern is formed to form the estimated pattern to be formed over the semiconductor wafer or the like by the synthetic pattern, and this estimated pattern and the inspected actual pattern can be compared to decide the proprieties of the auxiliary pattern and the phase shift pattern of the phase shift mask.

In other words, the propriety of the pattern data of the phase shift mask can be inspected to improve the reliability of the pattern data of the phase shift mask.

(2) According to the second invention thus far described, the pattern data in the phase shift pattern data layer, for example, is further separated in dependence upon the graphic processing so that the separated data layers can be independently processed. As a result, the data processing can be facilitated to promote the automatic processing using a computer.

By using the mask manufactured by the mask manufacturing process of the present invention, moreover, the transfer of a micro pattern can be precisely executed by transferring the circuit pattern on the mask to a semiconductor circuit wafer or a semiconductor wafer with an exposure beam such as the i-ray or a monochromatic ultraviolet ray of the excimer laser by the step-and-repeat method using a lens scale-down projection exposer.

What is claimed is:

1. A method for making a phase-shifting mask in which an integrated circuit pattern on the phase-shifting mask is formed in accordance with a mask pattern drawing data, obtained from a mask pattern data at least having (1) an actual pattern data corresponding to at least one opening pattern or light shielding pattern on the mask to be transferred onto an integrated circuit wafer, (2) an auxiliary pattern data not corresponding to the at least one opening pattern or light shielding pattern on the mask to be transferred onto the integrated circuit wafer, and (3) a shifter pattern data corresponding to at least one shifter pattern on the mask, by carrying out pattern inspection and any necessary correction with an electronic graphic processing system which can memorize graphic data and can carry out a desired arithmetic process thereto, the method comprising steps of:

(i) storing the mask pattern data in the electronic graphic processing system so as to be able to electronically independently access the actual pattern data, the auxiliary pattern data, and the shifter pattern data respectively; and then (ii) carrying out graphic inspection of the mask pattern data stored in step (i).

2. A method for making a phase-shifting mask according to claim 1, further comprising steps of:

(iii) based on the result of step (ii), carrying out any necessary correction of the mask pattern data;

(iv) after steps (i) to (iii), in accordance with the mask pattern data or a light shielding pattern drawing data for patterning at least one light shielding pattern obtained therefrom, carrying out patterning of a light shielding film on the mask for patterning the light shielding film; and (v) after steps (i) to (iii), in accordance with the mask pattern data or a shifter pattern drawing data for patterning at least one shifter pattern obtained therefrom, carrying out patterning of a shifter film on the mask for patterning the shifter film.

3. A method for making a phase-shifting mask in which an integrated circuit pattern on the phase-shifting mask is formed in accordance with a mask pattern drawing data, obtained from a mask pattern data at least having (1) an actual pattern data corresponding to at least one opening pattern or light shielding pattern of the mask to be transferred onto an integrated circuit wafer, (2) an auxiliary pattern data not corresponding to the at least one opening pattern or light shielding pattern of the mask to be transferred onto the integrated circuit wafer, and (3) a shifter pattern data for patterning at least one shifter pattern of the mask, by carrying out pattern inspection and any necessary correction with electronic graphic processing which can memorize graphic data and can carry out a desired arithmetic process thereto, the method comprising steps of:

(i) storing the mask pattern data by electronic graphic processing so as to electronically independently access the actual pattern data, the auxiliary pattern data, and the shifter pattern data respectively; and then (ii) carrying out graphic inspection of the mask pattern data stored in step (i).

4. A method for making a phase-shifting mask according to claim 3, further comprising steps of:

(iii) based on the result of step (ii), carrying out necessary correction to the mask pattern data by electronic data processing;

(iv) after steps (i) to (iii), in accordance with the mask pattern data or a light shielding pattern drawing data for patterning at least one light shielding pattern obtained therefrom, carrying out patterning of a light shielding film of the mask for patterning the light shielding film; and (v) after steps (i) to (iii), in accordance with the mask pattern data or a shifter pattern drawing data for patterning at least one shifter pattern obtained therefrom, carrying out patterning of the least one shifter pattern of the mask.

5. A method for making a phase-shifting mask according to claim 3, wherein the step of carrying out graphic inspection of the mask pattern data stored in step (i) is performed by electronic graphic processing.

6. A method for making a phase-shifting mask according to claim 3, wherein at least one of the actual pattern data, the auxiliary pattern data and the shifter pattern data are divided into at least two sub-pattern data, the at least two sub-pattern data being stored by the electronic graphic processing so as to be electronically individually accessed.

7. A method for making a phase-shifting mask according to claim 6, wherein the shifter pattern data are divided into at least two sub-pattern data which are stored by the electronic graphic processing so as to be electronically individually accessed.

* * * * *